US008766667B2

(12) United States Patent
Nowick et al.

(10) Patent No.: US 8,766,667 B2
(45) Date of Patent: *Jul. 1, 2014

(54) ASYNCHRONOUS DIGITAL CIRCUITS INCLUDING ARBITRATION AND ROUTING PRIMATIVES FOR ASYNCHRONOUS AND MIXED-TIMING NETWORKS

(71) Applicant: The Trustees of Columbia University in the City of New York, New York, NY (US)

(72) Inventors: Steven M. Nowick, Leonia, NJ (US); Michael Horak, Ellicott City, MD (US); Matthew Carlberg, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/724,374

(22) Filed: Dec. 21, 2012

(65) Prior Publication Data
US 2013/0113519 A1    May 9, 2013

Related U.S. Application Data

(63) Continuation of application No. 13/003,196, filed as application No. PCT/US2009/050561 on Jul. 14, 2009, now Pat. No. 8,362,802.

(60) Provisional application No. 61/080,591, filed on Jul. 14, 2008.

(51) Int. Cl.
*H03K 19/00* (2006.01)
*H04J 3/02* (2006.01)

(52) U.S. Cl.
USPC ........ 326/52; 326/104; 365/222; 365/198.04; 713/503; 713/400

(58) Field of Classification Search
USPC ............ 711/167, 150; 710/240, 119, 107, 36, 710/40, 113, 244, 241; 327/3, 19; 365/222, 365/233.1, 233.16, 189.04; 326/54, 94
See application file for complete search history.

(56) References Cited

U.S. PATENT DOCUMENTS

| 4,841,178 A | 6/1989 | Bisson |
| 4,998,030 A | 3/1991 | Cates |
| 5,329,529 A | 7/1994 | Murphy et al. |

(Continued)

OTHER PUBLICATIONS

International Search Report and Written Opinion for PCT/US2009/050561 dated Jul. 14, 2009.

(Continued)

*Primary Examiner* — Vibol Tan
(74) *Attorney, Agent, or Firm* — Hunter Clark PLLC

(57) ABSTRACT

Asynchronous digital circuits are described, including arbitration and routing primitives for asynchronous and mixed-timing networks. An asynchronous arbitration primitive has two data inputs and one data output. A mutual exclusion element is used to select the first-arriving data request from one of the two inputs to the output. A asynchronous routing primitive has one data input and two data outputs. The incoming data is routed to one of the two outputs based on a routing bit accompanying the data. The primitives use handshaking with request and acknowledge signals to ensure that data is passed when neighboring circuits are ready to receive or send data.

20 Claims, 17 Drawing Sheets

(56) References Cited

U.S. PATENT DOCUMENTS

| | | | |
|---|---|---|---|
| 5,404,556 A | 4/1995 | Mahowald et al. | |
| 5,455,912 A | 10/1995 | Ludwig | |
| 5,666,535 A | 9/1997 | Komori et al. | |
| 5,875,339 A | 2/1999 | Molnar et al. | |
| 6,266,712 B1 | 7/2001 | Henrichs | |
| 6,850,092 B2 | 2/2005 | Chelcea et al. | |
| 6,958,627 B2 | 10/2005 | Singh et al. | |
| 7,225,283 B1* | 5/2007 | Nayak et al. | 710/241 |
| 7,383,459 B1 | 6/2008 | Jones | |
| 7,383,730 B2 | 6/2008 | Huang et al. | |
| 7,389,373 B2 | 6/2008 | Birsan | |
| 8,222,915 B2* | 7/2012 | Manohar et al. | 326/11 |
| 8,294,490 B1* | 10/2012 | Kaviani | 326/41 |
| 8,402,164 B1* | 3/2013 | Parlour et al. | 709/238 |
| 8,612,815 B2* | 12/2013 | Pakbaz et al. | 714/733 |
| 2011/0169525 A1 | 7/2011 | Gill et al. | |

OTHER PUBLICATIONS

Bainbridge, J. et al., "Chain: A delay-insensitive chip area interconnect," IEEE Micro, 22(5): 16-23, 2002.

Balkan, A.O. et al., "A mesh-of-trees inter-connection network for single-chip parallel processing," In Proceedings of the IEEE 17th Intl. Conf. on App.-specific Systems, Architectures and Processors, pp. 73-80, 2006.

Balkan, A.O. et al., "Layout-accurate design and implementation of a high-throughput inter-connection network for single-chip parallel processing," In Hot Interconnects, Aug. 2007.

Beigne, E. et al., "An asynchronous NOC architecture providing low latency service and its multi-level design framework." Intl. Symp. on Async. Circuits and Systems, pp. 54-63, 2005.

Brunvand, E. "Translating Concurrent Communicating Programs into Asynchronous Circuits," Ph.D. thesis, Carnegie Mellon University, 1991.

Chapiro, D., "Globally-Asynchronous Locally-Synchronous Systems," Ph.D. Thesis, Stanford University, 1984.

Chelcea, T. et al., "Robust interfaces for mixed-timing systems," IEEE Transactions on VLSI Systems, 2004.

Dally, W. et al. "Principles and Practices of Interconnection Networks," Chapter 23, pp. 449-471. Morgan Kaufmann Publishers Inc., 2003.

Dally, W. et al., "The torus routing chip," Distributed Computing, 1(3), 1986.

Fuhrer, R. M. at al., "Sequential Optimization of Asynchronous and Synchronous Finite-State Machines: Algorithms and Tools," Chapter 8, pp. 195-217. Kluwer Academic Publishers, 2001.

Van Gageldonk, H. et al., An asynchronous low-power 80c51 microcontroller, In IEEE Intl. Async. Symp. pp. 96-107, 1998.

Hollis, S. et al., Rasp: an area-efficient, on-chip network. In IEEE Intl. Conf. on Comp. Design, 2006.

Horak, M.N. "A high-throughput, low-power asynchronous mesh-of-trees interconnection network for the Explicit Multi-Threading (XMT) parallel architecture," Masters thesis, University of Maryland, College Park, 2008.

Iyer, A. et al., "Power and performance evaluation of globally asynchronous locally synchronous processors," In ISCA, pp. 158-168. 2002.

Krstic, M. et al., Globally asynchronous, locally synchronous circuits: Overview and outlook. IEEE Design & Test of Computers, 24(5): 430-441, Sep. 2007.

Leighton, F. T. "Introduction to parallel algorithms and architectures: array, trees, hypercubes," Chapter 2, pp. 277-387, Morgan Kaufmann, 1992.

Lines, A. Asynchronous interconnect for synchronous SoC design. IEEE Micro, 24(1):32-41, 2004.

Owens, J.D. et al., "Research challenges for on-chip interconnection networks," IEEE Micro, 27(5): 96-108, 2007.

Plana, L.A. et al., "A GALS infrastructure for a massively parallel multiprocessor," IEEE Des. Test, 24(5): 454-463, 2007.

Seitz, C.L. et al., "A family of routing and communication chips based on the Mosaic," In Proceedings of the Symp. on Research on Intergrated Sys ems, pp. 320-337, 1993.

Shi, F. et al., "Test Generation for Ultra-High-Speed Asynchronous Pipelines," International Test Conference, Paper 39.1, 2005 IEEE, pp. 1-10.

Singh, M. et al., "Mousetrap: high-speed transition-signaling asynchronous pipelines," IEEE Transactions on VLSI Systems, 15(6): 684-697, Jun. 2007.

Singh, M. et al., "Mousetrap: Ultra-High-Speed Transition-Signaling Asynchronous Pipelines," IEEE International Conference on Computer Design (ICCD '01), 2001, pp. 9-17.

Sutherland, I.E. "Micropipelines," Comm. ACM, 32(6), 1989.

Teehan, P. et al., "A survey and taxonomy of GALS design styles," IEEE Design & Test, 2007.

Zhu, Y. et al., "A high-performance, energy efficient GALS processor microarchitecture with reduced implementation complexity," In Proceedings of IEEE ISPASS, pp. 42-53, 2005.

* cited by examiner

1400

(a) LP Single Port (b) TPP Single Port (c) LP Alternating Ports (d) TPP Alternating Ports

1500

(a)

(b)

ASYNCHRONOUS DIGITAL CIRCUITS INCLUDING ARBITRATION AND ROUTING PRIMATIVES FOR ASYNCHRONOUS AND MIXED-TIMING NETWORKS

CROSS-REFERENCE TO RELATED APPLICATIONS

This application is a continuation application of, and claims priority to, U.S. patent application Ser. No. 13/003,196, entitled "ASYNCHRONOUS DIGITAL CIRCUITS INCLUDING ARBITRATION AND ROUTING PRIMITIVES FOR ASYNCHRONOUS AND MIXED-TIMING NETWORKS," which is a National Phase application under 35 U.S.C. §371 of International Patent Application No. PCT/US2009/050561, filed Jul. 14, 2009, which claims priority to U.S. Provisional Patent Application No. 61/080,591, filed Jul. 14, 2008, each of which is hereby incorporated by reference herein in its entirety.

STATEMENT REGARDING FEDERALLY SPONSORED RESEARCH

This invention was made with government support under 0086036, awarded by the National Science Foundation (NSF). The government has certain rights in the invention.

TECHNICAL FIELD

The disclosed subject matter relates to asynchronous digital circuits, including arbitration and routing primitives for asynchronous and mixed-timing networks.

BACKGROUND

Asynchronous, or clockless, logic design provide certain advantages over synchronous designs, such as in the area of power consumption. An asynchronous interconnection network would, for instance, save on power by eliminating the need for global clock distribution. Since clock power consumption is a major portion of total chip power, this can represent significant savings. Instead, different localized timing domains can exist on a single chip, glued together by an asynchronous interconnect fabric.

While synchronous designers employ clock-gating as a method of reducing dynamic power for inactive components on a chip, the asynchronous timing domains naturally provide this functionality by only transitioning nets when there is active computation.

Asynchronous designs, since they are self-timed, are also more tolerant of on-chip variations. Communication is typically localized between neighboring modules, which are similarly affected by manufacturing process and temperature. This locality property reduces verification efforts for designers. During normal operation, asynchronous circuits are more resilient to changes in temperature and voltage conditions and, unlike synchronous implementations, do not have to operate based on worst-case assumption.

Several network-on-chip solutions have been proposed to enable structured system design. A delay-insensitive chip area interconnect, named CHAIN, by Bainbridge et al., for example, provides robust self-timed communication for system-on-chip designs, including a multiprocessor for neural simulations. An asynchronous crossbar design, called Nexus, proposed by Lines provides system-level communication and has been used in Ethernet routing chips. Along with few other recent asynchronous on-chip-network architectures and designs, these earlier works provided asynchronous node architecture and implementation for coarse-grain complex-functionality primitive nodes. Each of these earlier proposed approaches has, however, limitations that restrict its applicability, for instance, to higher-end single-chip parallel processors.

A linear, low-overhead asynchronous pipeline called MOUSETRAP proposed by Singh and Nowick can provide high-throughput operation by using a single register based on level-sensitive latches to store data. Its simple stage control consisting of only a single combinational gate also contributes to its high-throughput operation. Also, unlike most synchronous pipelines that require expensive single registers made of flip-flops or double-latches, MOUSETRAP provides high storage capacity with low area using a single latch-based register in each stage.

U.S. Pat. No. 6,958,627 (the '627 patent) to Singh and Nowick describes Asynchronous MOUSETRAP pipelines. The '627 patent provided three primitive asynchronous cell designs: a linear cell (1-input, 1-output), a fork cell (1-input, 2-outputs), and a merge cell (2-inputs, 1-output). The fork cell receives one input, and broadcasts it in parallel to both outputs. The merge cell receives two inputs, waits for both to arrive, and merges them together onto a single output stream.

SUMMARY

Some of the embodiments of the disclosed subject matter provide asynchronous arbitration circuits and asynchronous routing circuits. In some embodiments, an asynchronous arbitration circuit is provided, including: a multiplexer having first and second data inputs, a selection input and an output; a data register (REG) having an input connected to the output of the multiplexer, the data register having an enable input; a first latch (L1) having in input, an output, and an enable input, the input of the first latch (L1) providing a first request signal (Req0) input; a second latch (L2) having in input, an output, and an enable input, the input of the second latch (L2) providing a second request signal (Req1) input; a mutual exclusion element having a first and a second input and a first and a second output, the first output of the mutual exclusion element being connected to the enable input of the first latch (L1) and the second output of the mutual exclusion element being connected to the enable input of the second latch (L2), wherein at least one of the outputs of the mutual exclusion element controls the selection input of the multiplexer; and a third latch (L5) having an input, an output, and an enable input, the input of the third latch (L5) being connected to receive the first request signal (Req0) output by the first latch (L1) and the second request signal (Req1) output by the second latch (L2) combined through an XOR element; and an XNOR element having two inputs and an output, the inputs of the XNOR element being connected to receive the output of the third latch (L5) and an acknowledgement signal (Ack) input from a succeeding stage, respectively, and the output of the XNOR element being connected to the enable input of the third latch (L5) and the enable input of the data register (REG).

In some embodiments, an asynchronous routing circuit is provided, including: a data splitter having an input and a first and a second output; a first data register having an input connected to the first output of the data splitter, the first data register having an enable input; a second data register having an input connected to the second output of the data splitter, the second data register having an enable input; a first latch controller comprising a first latch having an output providing a first request signal (Req0) for output to a successive stage, the first latch controller having a request input for receiving a request signal (Req) from a preceding stage, and the first latch controller further having an enable output to output an enable signal to the first data register; and a second latch controller comprising a second latch having an output providing a second request signal (Req1) for output to a successive stage, the second latch controller having a request input for receiving the request signal (Req) from the preceding stage, and the second latch controller further having an enable output to output an enable signal to the second data register.

Embodiments of the disclosed subject matter may include one or more of the following features. The asynchronous arbitration circuit may further comprise a fourth latch (L6) having in input, an output, and an enable input, the input of the fourth latch (L6) being connected to the output of the first latch (L1) and the output of the fourth latch (L6) being connected to an input of the mutex through a logic element; and a fifth latch (L3) having in input, an output, and an enable input, the output of the fourth latch (L6) being connected to the input of the fifth latch (L3), an output of the mutual exclusion element being connected to the enable input of the fifth latch (L3), and the output of the fifth latch (L3) providing a first acknowledgement signal (Ack0) for output to a preceding stage.

The asynchronous arbitration circuit may further comprise a sixth latch (L7) having an input, an output, and an enable input, the input of the sixth latch (L7) being connected to the output of the second latch (L2) and the output of the sixth latch (L7) being connected to an input of the mutex through a logic element; and a seventh latch (L4) having in input, an output, and an enable input, the output of the sixth latch (L7) being connected to the input of the seventh latch (L4), an output of the mutual exclusion element being connected to the enable input of the seventh latch (L4), and the output of the seventh latch (L4) providing a second acknowledgement signal (Ack1) for output to a preceding stage.

The asynchronous arbitration circuit may further comprise a fourth latch (L6) having in input, an output, and an enable input, the output of the fourth latch (L6) being connected to an input of the mutex through a logic element; and a fifth latch (L3) having in input, an output, and an enable input, the output of the first latch (L1) being connected to the input of the fifth latch (L3), the output of the fifth latch (L3) being connected to the input of the fourth latch (L6), an output of the mutual exclusion element being connected to the enable input of the fifth latch (L3), and the output of the fifth latch (L3) providing a first acknowledgement signal (Ack0) for output to a preceding stage.

The asynchronous arbitration circuit may further comprise a sixth latch (L7) having an input, an output, and an enable input, the output of the sixth latch (L7) being connected to an input of the mutex through a logic element; and a seventh latch (L4) having in input, an output, and an enable input, the output of the second latch (L2) being connected to the input of the seventh latch (L4), the output of the seventh latch (L4) being connected to the input of the sixth latch (L7), an output of the mutual exclusion element being connected to the enable input of the seventh latch (L4), and the output of the seventh latch (L4) providing a second acknowledgement signal (Ack1) for output to a preceding stage.

The first latch controller in the asynchronous routing circuit may have a first acknowledgement input for receiving a first acknowledgement signal (Ack0) from a succeeding stage. The first latch controller in the asynchronous routing circuit may also have an acknowledgement feedback input to receive an acknowledgement signal (Ack) that is concurrently sent to a preceding stage. And the acknowledgement signal (Ack) that is sent to the preceding stage is formed by the combination of the first request signal (Req0) and the second request signal (Req1) in an XOR element. A first acknowledgement signal (Ack0) from a succeeding stage may be input to the first latch of the first latch controller of the asynchronous routing circuit.

BRIEF DESCRIPTION OF THE DRAWINGS

The disclosed subject matter is illustrated in the figures of the accompanying drawings which are meant to be exemplary and not limiting, in which like references are intended to refer to like or corresponding parts, and in which.

DETAILED DESCRIPTION OF THE PREFERRED EMBODIMENTS

In the following description of the preferred embodiments, reference is made to the accompanying drawings that form a part hereof, and in which is shown by way of illustration a specific embodiment in which the disclosed subject matter may be practiced. It is to be understood that other embodiments may be utilized and structural changes may be made without departing from the scope of the present disclosed subject matter.

The embodiments disclosed herein provide asynchronous primitives circuits, including: a routing primitive (1 input, 2 outputs); and an arbitration primitive (2 inputs, 1 output). Unlike the fork cell in the '627 patent, the routing primitive does not broadcast the input data in parallel on its two output channels, but rather, outputs the data onto a selected one of its two output channels based on a control bit. Thus, the routing primitive acts as a pipeline de-multiplexer component.

Unlike the merge cell in the '627 patent, the arbitration primitive does not wait for inputs to arrive on both input channels and then merge them together into a single output stream. Instead, it uses an arbiter to select one of the arrived inputs (when an input has arrived on at least one input channel), and then directs that one input to the output channel. Thus, the arbitration primitive acts as a pipeline arbitrate-then-multiplex component. If an input on the other input channel is also present, and did not win arbitration, it is not deleted. Rather, the later-arriving input remains pending on its input channel, until the current transaction is complete (i.e., the data is output by the cell). Then, the arbiter is again activated, so the later-arriving data can win arbitration and be directed to the output channel.

Figure 1:
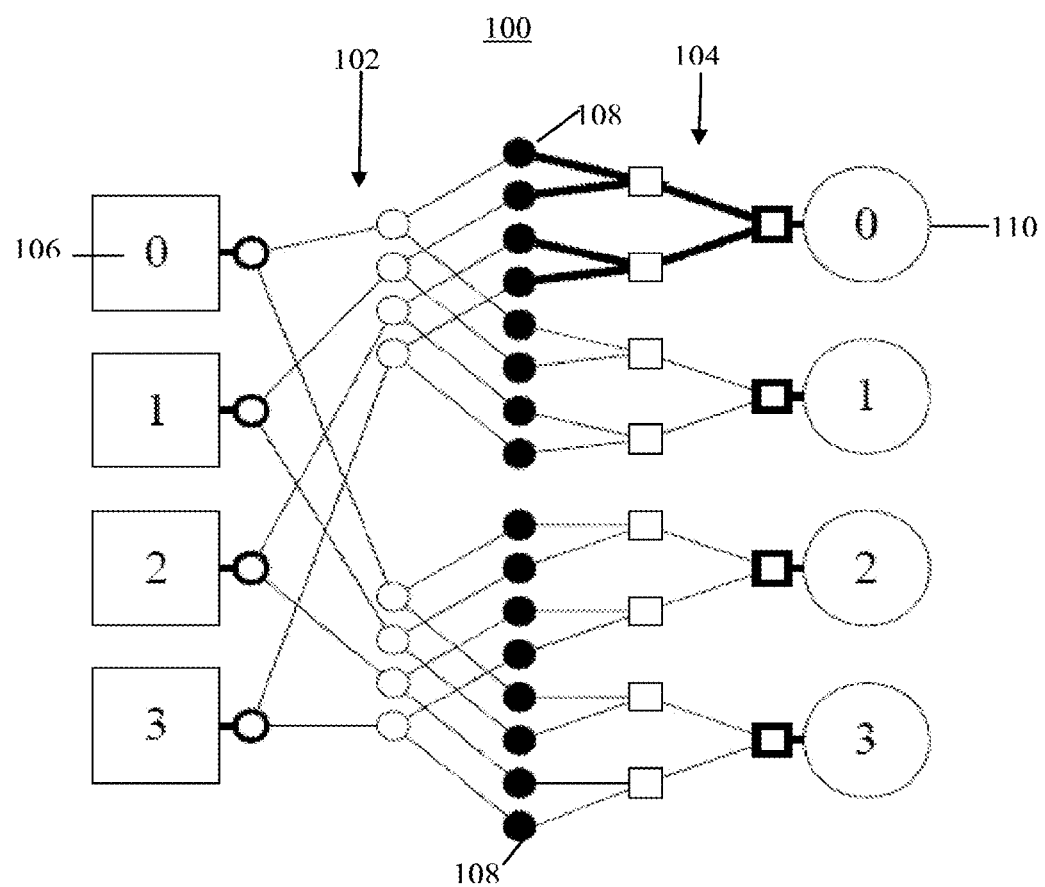
FIG. 1 illustrates a mesh-of-trees network that is made of asynchronous routing nodes and arbitration nodes in accordance with an embodiment of the disclosed subject matter.

FIG. 1 shows a mesh-of-trees network 100 that is designed to provide the needed bandwidth for a high-performance, fine-grained parallel processor using global shared memory. The mesh-of-trees network 100 includes two main structures: binary fan-out trees 102 and binary fan-in trees 104. In the binary fan-out trees 102, each source 106 is a root and connects to two children and each child in turn has two children of their own. The leaf nodes 108 of the binary fan-out trees 102 are also the leaf nodes 108 in the binary fan-in trees 104, which have destinations 110 as their roots. A mesh-of-trees network that connects N sources and N destinations, for instance, has log(N) levels of binary fan-out trees and log(N) levels of binary fan-in trees and there is a unique path between each source-destination pair.

In one embodiment, the sources 106 and the destinations 110 may be processors and shared memory banks, respectively. In some embodiments, the destinations 110 may be processing components as well. Yet in other embodiments, the destinations 110 may be other resources, such as direct memory access controllers, network interface controllers, input-output controllers, and a pool of data buffers.

A memory request packet travels from a root 106 in the mesh-to-trees network 100 to one of the leaf nodes 108 of the corresponding binary fan-out tree 102. The request packet then passes from the leaf node 108 through the corresponding fan-in tree 104 (which shares the common leaf node 108 with the fan-out tree) and travels to the root of that fan-in tree to reach its destination 110. In general, contention can occur in interconnection meshes when two packets from different sources 106 to different destinations 110 compete for shared resources. In the mesh-to-trees network 100, however, the binary fan-out trees 102 eliminate competition between packets from different sources 106, and the binary fain-in trees 104 eliminate competition between packets to different destinations 110.

This separation guarantees that, unless the memory access traffic is extremely unbalanced, packets between different sources 106 and destinations 110 are not likely to interfere, thereby the mesh-to-trees network 100 can provide high average throughput that may be close to its peak throughput. There are three switching primitives in a mesh-to-trees network, such as the mesh-to-trees network 100. They are a routing primitive, an arbitration primitive, and a linear pipeline primitive. Whereas the routing primitive and arbitration primitive arc necessary elements of a mesh-to-trees network, the linear pipeline primitive is an optional element for performance improvement, acting as a micro-architectural repeater to divide long wires into multiple short segments.

Figure 2:
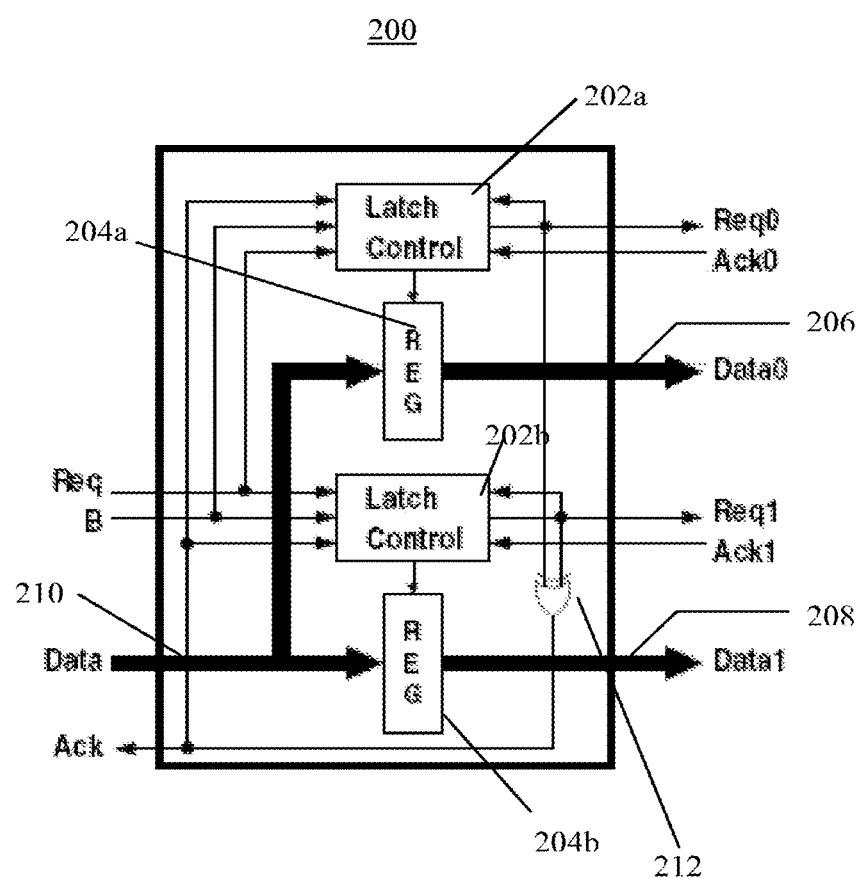
FIG. 2 is a block diagram illustrating a routing primitive circuit in accordance with an embodiment of the disclosed subject matter.

FIG. 2 illustrates a routing primitive circuit 200 that is based on a linear asynchronous pipeline called MOUSETRAP, as described in the '627 patent. Each routing primitive 200 stage uses registers based on level-sensitive latches, rather than edge-triggered flip-flops to store data, and a simple stage control consisting of only a single combinational gate.

The design of the routing primitive 200 has several advantages. For example, it can communicate using a transitional signaling protocol that provides high throughput by requiring only one round-trip communication per channel per transaction, rather than two round-trips for commonly-used four-phase protocols. Also, it can save significant power and channel area by using a single-rail bundled data protocol, which uses dense data channels (one wire per each bit), rather than asynchronous delay-insensitive encoding.

In addition, the routing primitives provide high storage capacity (i.e., 100%) with low area. In congested scenarios, for instance, each stage can hold distinct data items in each latch-based register. By contrast, most synchronous, and some asynchronous circuits, require more "expensive" (i.e., in terms of power, space on the chip, etc.) registers, which use flip-flops or double-latches, or double registers. Moreover, the routing primitive 200 can be designed using static standard cell components, with simple one-sided timing constraints, and therefore can be used within standard digital flows.

The routing primitive 200 shown in FIG. 2 includes a set of latch controller 202a, 202b and a register 204a, 204b for each of its two output ports 206, 208. In some embodiments, each register 204a, 204b may be a standard level-sensitive D-type transparent latch register that is normally opaque, thereby preventing data from passing through.

Figure 3:
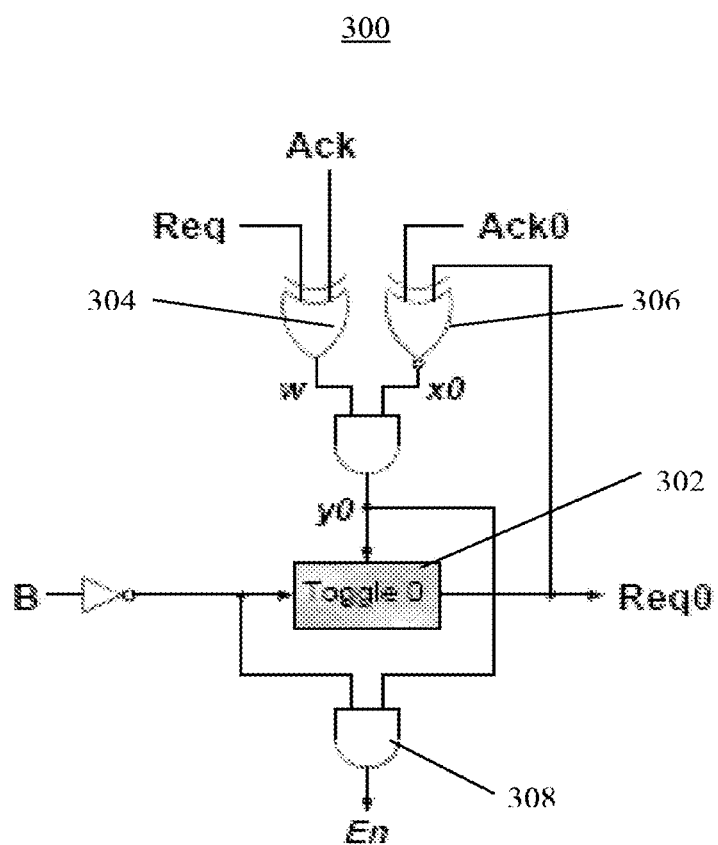
FIG. 3 is a block diagram illustrating a latch controller of the routing primitive of FIG. 2 in accordance with an embodiment of the disclosed subject matter.

FIG. 3 illustrates a latch controller 300, such as the latch controller 202a, 202b (in the second of the two latch controllers 202b, Req0/Ack0 are replaced by Req1/Ack1, x0/y0 are replaced by x1/y1, Toggle 0 is replaced by Toggle 1, and the B input to Toggle 1 does not go through an inverter). The latch controller 300 includes a toggle element 302, an XOR gates 304, an XNOR gate 306, and an AND gate 308. In some embodiments, the toggle element 302 is implemented using a T-latch. In some embodiments, a delay circuitry is added on the feedback paths of the T-latch to allow the latch controllers 202a, 202b in the routing primitive 200 enough time to disable the T-latch before a second toggle occurs.

The latch controller 300 is responsible for controlling three signals. They are a register enable signal (En), the corresponding request output ($Req_0/Req_1$) to the next stage, and the acknowledgment (Ack) to the previous stage. More specifically, the latch controllers are responsible for enabling and disabling the data latches 204a, 204b. Each latch controller 202a, 202b takes as input handshaking signals from the input port (Req, Ack) and their respective output port 210 ($Req_0/Req_1$, $Ack_0/Ack_1$).

The handshaking signals use a 2-phase transition signaling protocol that can be in one of two phases: transaction pending or transaction complete. The latch controller 202a, 202b assesses the status of each port using XOR gate 304 and XNOR gate 306, which function as equality testers for request and acknowledgment signals. The XOR gate 304 partially enables the latch controller 202 output when there is a pending transaction on the input port 210. The XNOR gate 306 partially enables the latch controller output when there is a completed transaction on the corresponding output port.

The routing primitive 200 can perform the fan-out, or demultiplexing, operation with one input port 210 and two output ports 206, 208. During the operation, packets arriving at the input port 210 are directed to exactly one of the two output ports 206, 208. For example, adjacent primitives communicate using request (Req) and acknowledgement (Ack) signals following a transition-signaling protocol. The basic operation, assuming an empty primitive, begins with new data arriving along with a routing signal B.

An important feature of the routing primitive 200 is that, unlike MOUSETRAP pipeline stages, the registers 204a, 204b are normally opaque (i.e., disabled), preventing data from propagating to subsequent stages before the routing decision is made. After receiving stable and valid data inputs, a request transition on Req occurs at the input. The latch controller 202a, 202b selected by the routing signal B, enables its latches 204a, 204b (i.e., makes them transparent) and data advances to the selected output channel 206, 208.

The toggle element 302 generates a request transition on $Req_0/Req_1$ to the following stage. It is used to convert an input Req transition to an output transition $Req_0/Req_1$ on an appropriate port. Then, in parallel, the latch controllers 202a, 202b quickly close the latches, safely storing data, and an acknowledgment transition on Ack is sent to the previous stage. The acknowledgment (Ack) signal to the left environment is generated by the XOR gate 212. The XOR gate 212 merges two transition signals, $Req_0$ and $Req_1$. The toggle output for a specific port will transition once for every data item, when both toggle input ($Y_{0,1}$) and enable (En) inputs are high.

More specifically, and assuming the routing bit, B, is set to 0 (i.e., the data is to be routed to Data0), the latch controller 202a behavior is specified by three signal values: w, $x_0$, and $y_0$. Signal w is the output of an XOR gate 304 that examines the left input side interface. The XOR gate 304 is an inequality tester for the Req and Ack signals that generates a partial enable, w, to both sets of latches 204a, 302 in the primitive. The data register latches 204a are initially opaque and toggle latch 302 is disabled. When Req transitions on the left input channel, w is asserted high, enabling both latches 204a and 302. When the data passes through the data register latches 204a to the appropriate output channel and latch 302 toggles (resulting in a transition in Req0), then Ack transitions, de-asserting w and ensuring that the latches 204a are opaque and toggle latch 302 is disabled.

Signal $x_0$ is the output of an XNOR gate 304 that reflects the state of the right output side interface. Likewise, $x_1$ serves the same purpose for the bottom interface (port 1). The XNOR gate 306 is an equality tester for the $Req_0$ and $Ack_0$ signals that partially enables the corresponding set of latches 204a, 302 in the primitive 200. Initially, $x_0$ is asserted, since the right environment may accept a new request. When new data is forwarded to the right environment at the top interface (port 0), $Req_0$ transitions and $x_0$ is de-asserted. When the request is acknowledged, $Ack_0$ transitions and $x_0$ is asserted, partially enabling the next operation. Signal $y_0$ combines the w and $x_0$ signals, and is asserted when a new input data has arrived and the following stage is ready to accept new data (w and $x_0$ are HIGH) and de-asserted after new data is routed to the following stage (w or $x_0$ is LOW).

Initially, all inputs and outputs are LOW. The w and $y_0$ signals are initially LOW since there are no pending input requests, thus disabling all toggle elements 302 and data latches 204a, 204b. The $x_0$ signal is initially HIGH since there are no pending output requests to port 0. An important feature of the routing primitive 200 is that, unlike MOUSETRAP pipeline stages, the latches 204a, 204b in the routing primitive 200 are normally opaque (disabled). The motivation for this approach is to prevent propagation of data bits through latches 204a, 204b until after the routing decision is determined, thus saving dynamic power from unnecessary transitions.

First, new data and a stable B signal appear at the input port 210. It is important that B is bundled with the Req transition according to requisite bundling constraint. Assuming that B is LOW for this data packet, the toggle element 302 and D-latches 204a for port 0 will each be half enabled.

Next, Req transitions, then w is asserted high. The w and $x_0$ signals together fully enable the latch controller output, $y_0$. With $y_0$ and the correct B signal asserted, the toggle element 302 output transitions and the latches 204a, 204b become transparent (enabled). Note that when w is asserted, it affects both latch controllers 202a, 202b, and $y_1$ will also be enabled. However, since B is LOW, the toggle and latches 204b for port 1 will remain disabled.

The toggle output transition will cause four events to occur in parallel: (1) a $Req_0$ output transition is passed to the next stage, (2) the $Req_0$ transition is used as a feedback signal to disable $x_0$, (3) an Ack transition is generated to the left environment, and (4) the Ack transition is used to disable w. The end result is that $y_0$ will be de-asserted, disabling the toggle and closing the latches 204a, 204b. The data is now safely stored in the current stage, and the left environment (which was acknowledged) is free to send new data. There is a pending request to the next stage on port 0, awaiting an $Ack_0$ transition.

The routing primitive 200 includes a capability to decouple processing between the two output routing channels 206, 208. In particular, if one of the output channels 206, 208 is stalled, awaiting acknowledgment, the other output channel 206, 208 can successively process multiple full transactions. This concurrency feature has the potential for significant system-level performance benefits because it entirely avoids stalling input packets heading to an unblocked output channel 206, 208.

Figure 4:
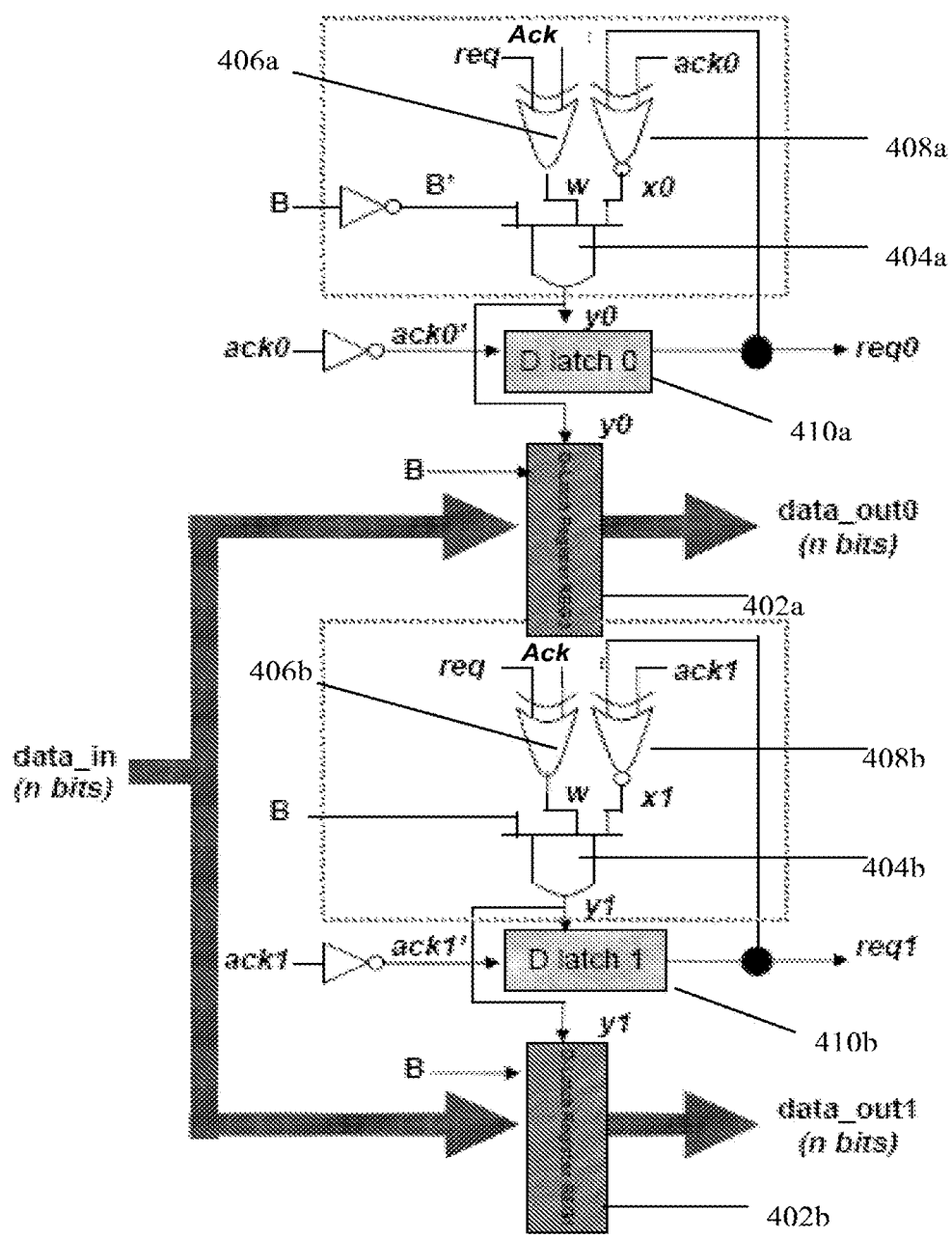
FIG. 4 is a block diagram illustrating an alternative embodiment of a routing primitive circuit.

FIG. 4 illustrates an alternative embodiment of a routing primitive circuit 400. The routing primitive 400 includes two data register banks ($REG_0$ and $REG_1$) of D-latches, 402a, 402b, which can, for example, be the same type of register as in the previously-described embodiment. Each bank 402a, 402b can have a single level-sensitive D-latch per bit 410. These D-latches 410 have more restrictive enabling conditions than MOUSETRAP-style D-latches, so that they are normally opaque. This avoids propagation of data bits through the latches until after the selection is determined. The control logic of this embodiment differs from the embodiment shown in FIG. 3 in that it uses 1-bit, transparent D latches (410a/410b), rather than 1-bit toggle latches (T latches) (302). Among other advantages, the D-latches can be more commonly-available and faster than toggle latches. There are also differences in the control logic of these two embodiments, as further discussed below.

There are three enabling conditions and each feeds into an AND gate 404a, 404b. They are: B', w, and $x_0$. The XOR gate 406a, 406b producing w is initially LOW, or 0, setting the output $y_0$ of the AND gate 404a, 404b to 0. XOR gate 406a, 406b waits for input data (data_in), which includes the Boolean signal (B), to arrive. The B is part of the bundled datapath, and thus arrives before the incoming Req. When data_in arrives, the data request (Req) makes a transition, causing w to go to HIGH, or 1. The w will, hence, be always set to 1 whenever any new Req arrives even if it will not be directed to the current register bank 402a, 402b by B.

Eventually, after one of the data registers 402a, 402b becomes transparent, one of $Req_0$ or $Req_1$ will transition, as the input data is directed either to the $REG_0$ or $REG_1$. Then, an XOR gate 406a, 406b serves as a merge operator and will reset w to 0, setting both $y_0$ and $y_1$ to 0 and disabling the corresponding two AND gates 404a, 404b. In sum, considering when the XOR gate 406a, 406b produces w, it can be seen that this control gate turns on whenever a new input arrives (i.e., as in the previously-described embodiment, the circuit receives a Req signal from the preceding stage, as shown in FIG. 2, which forms an input of the XOR gate 406a, 406b) and turns off whenever the data is directed to one of the two output streams (which results in Ack making a transition—the Ack signal being formed through an XOR of $Req_0$ and $Req_1$, as in FIG. 2). In other words, w is asserted HIGH only during a time window from when new data arrives on the input channel to when the new data is forwarded to the correct output channel indicated by B.

The second control gate for REGs 402a, 402b is XNOR gate 408a, 408b whose output is $x_0$. Initially $x_0$ is HIGH since $Req_0$ and $Ack_0$ have the same value and, therefore, both $x_0$ and $x_1$ partially enable the registers $REG_0$ 402a and $REG_1$ 402b as long as the corresponding output channel communication is complete. That is: a $Req_0$ transition followed by acknowledgment $Ack_0$ transition means that the transmission on output channel 0 (data_out$_0$) is complete, and $x_0$ output is set to 1; likewise when a transaction on output channel 1 (data_out$_1$) is complete, $x_1$ output is set to 1. Once w is also enabled, then exactly one of the two AND gates 404a, 404b is enabled.

For an AND gate 404a, 404b to be asserted, three conditions must hold: (1) w is HIGH (i.e., arrival of new input data that has not yet been directed to an output channel), (2) the corresponding x0/x1 value is HIGH (i.e., the corresponding output channel is stable, with no pending respective acknowledgment), and (3) the output channel is selected (data_out$_0$ selected if B is 0 and data_out$_1$ selected if B is 1).

Once either $y_0$ or $y_1$ is asserted, the control enables the corresponding datapath D-latch register 402a, 402b, making it transparent and thereby allowing data to appear on the desired output channel. In addition, a corresponding $Req_0$ or $Req_1$ output transition is generated through one of the two single-bit D-latches 410a, 410b, depending on whether B is 0 or 1, respectively. D-latch 410a, 410b is enabled by the corresponding $y_0$ or $y_1$ signal and its input is an inverted version of the previous respective output acknowledgment $Ack_0$ or $Ack_1$, thereby in effect performing a toggle operation on its output.

Note that it is assumed B is valid and stable on the input channel from before a Req transition arrives to after the corresponding subsequent Ack transition is generated. Therefore, during the time window where w makes an enabling pulse (from LOW to HIGH back to LOW), B is valid and unchanging. Finally, w will be de-asserted (LOW) after generating the transition on Ack, $y_0/y_1$ will be de-asserted (LOW) after generating the transition on $Ack_0/Ack_1$, and single-bit D-latch 410a, 410b and D-latch register (REG) 402a, 402b will again become opaque.

Suitable delays may need to be added in circuit paths to ensure that D-latch 410a, 410b and REG 402a, 402b are enabled, or transparent, long enough to pass data to output channel when the channel is activated. Ack should not transition in response to Req transition until (1) w is set to LOW, (2) transparent single-bit D-latch 410a, 410b and REG 402a, 402b are disabled, and (3) suitable hold time on REG is complete. Likewise, a new Req should not transition in response to Ack transition until the conditions set forth above are met. In some embodiments, suitable delay can be added on the Req and Ack outputs to ensure the circuit is stabilized and that the timing constraints hold.

The routing primitive 400 includes simple standard cell components without any specialized asynchronous cells. Two D-latches are used instead of the use of toggle latches because D-latches tend to be faster in practice and are more commonly used. The routing primitive 400 of this embodiment has several advantages over the routing primitive 200 of FIGS. 2 and 3. First, the routing primitive 400 of this embodiment generates y signals using an additional new input B'. In the other routing primitive 200, the y signals could potentially glitch if the output channel had a pending unacknowledged output while the output channel Ack arrived during a transaction. While this glitching was masked and did not propagate through the En register, it still results in more complicated design validation. In contrast, neither $y_0$ nor $y_1$ will glitch in this scenario for the routing primitive 400 of this embodiment.

Second, in this routing primitive 400, the same latch control (y) is used for both an output channel single bit D-latch 410a, 410b and n-bit D-register 402a, 402b. Finally, the latency related to generating the Req transition may be shorter in the routing primitive 400, because the critical path goes through a simpler D-latch, rather than toggle latch.

Figure 5:
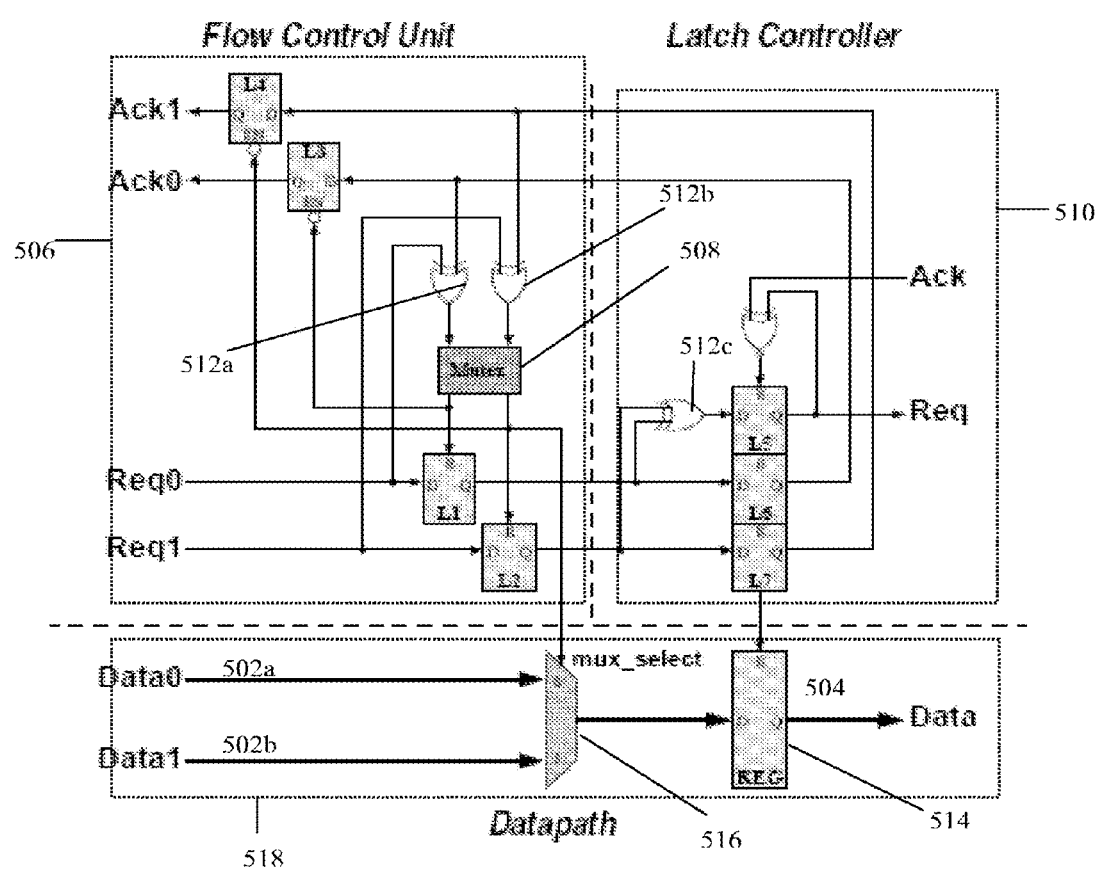
FIG. 5 is a block diagram illustrating an arbitration primitive in accordance with an embodiment of the disclosed subject matter.

FIG. 5 illustrates an arbitration primitive 500. The arbitration primitive 500 accepts data from exactly one of two input ports 502a, 502b and forwards the data to a single output port 504, thereby providing complementary functionality to the routing primitive 200, 400.

An arbitration operation begins with new data appearing at the input of an empty primitive followed by a request transition from the previous stage to the flow control unit 506. The flow control unit 506 will arbitrate the request through a mutex component 508 and perform two actions: setting the correct multiplexer select signal (mux_select) and forwarding the winning request to the latch controller 510 by enabling either L1 or L2. The latch controller 510 will then store the new data and concurrently generate a request to the next stage while acknowledging to the flow control unit 506 that data has been safely stored. At this point, the flow control unit will reset the mutex 508 and then acknowledge to the previous stage that it may accept new data on that channel, thereby completing the transaction.

The arbitration functionality is performed by the mutual exclusion element (mutex) 508. The arbitration primitive 500 includes, for example, seven standard level-sensitive D-type transparent latches, L1-L7. Latches L3 through L7 are all normally transparent (enabled). Latches L1 and L2 are normally opaque (disabled). XOR gates 512a, 512b are used at the inputs of the mutex 508 as "inequality" testers, generating a request transition to the mutex 508 when new data has arrived and then resetting the mutex 408 after that data has been stored in the register 514.

Another XOR gate 512c at the input of L5 functions as a "merge" element, joining two transition-signaling signals, $Req_0$ and $Req_1$, into a single signal, Req. The merge takes two input paths, where at most one of the paths is making a transition at any time, and merges the result. Finally, there is one multiplexer 516 and register 514 per data bit.

Figure 6:
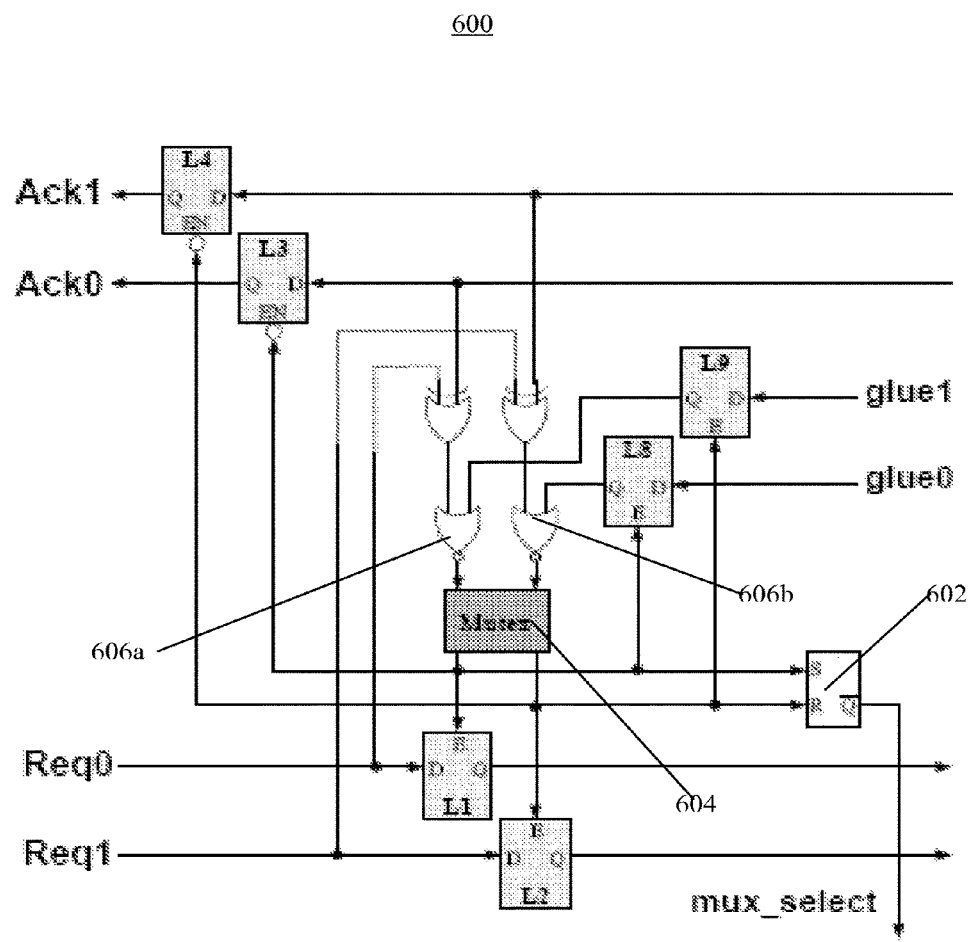
FIG. 6 is a block diagram illustrating an alternative embodiment of the flow control unit of the arbitration primitive of FIG. 5, in accordance with an embodiment of the disclosed subject matter.

FIG. 6 shows a flow control circuit 600 that can reduce unnecessary glitch power consumption that can occur on the data path 518. The glitch power consumption can occur because the mux_select signal may transition more than once per cycle for transactions on the $Req_1$ port. The optimization adds an SR latch 602 to store the most recent mutex 604 decision at the end of each transaction. The result of this optimization is that the mux_select is limited to at most one transition per transaction. The resulting power savings can be significant, since the majority of the power is consumed in the datapath 518.

The optimized flow control unit 600 can also support for multi-flit packets. A flow control unit, or flit, is the smallest granularity of message sent through the network. With multi-flit capability, wide packets are split into multiple flits that travel contiguously through the network. After the header (i.e., the first) flit of a multi-flit packet on one channel has won its arbitration, the selection of the mutex 604 must be biased so that the next flit of the same multi-flit packet also wins the mutex 604. To effect this biasing, the opposing request input to the mutex 604 is forced to zero, or "killed." This operation either prevents future requests at the other mutex 604 input from occurring, or in the case where a request was already pending, kills the opposing request until the entire multi-flit packet has advanced. The kill function is achieved using a NOR gate 606a, 606b located at the input of the mutex 604.

In the case of a multi-flit packet, suppose $Req_0$ wins arbitration in the mutex. After it goes through the left input of the mutex, it enables $Glue_0$ to pass through latch L8 and go to the NOR gate input on the right side of the mutex. Thus, it in effect "cancels" any request to the right input of the mutex (i.e., its potential competitor) by forcing the right mutex input to 0. This all happens just after the first bit (i.e., first "flit") of channel 0 wins. This 0 input due to the output of L8 remains at the right input of the mutex until after the last flit of the channel 0 packet arrives. When this last flit arrives, which has glue0 now set to 0, it still has no contention in the mutex, so passes through it again (asserting the left mutex output high again). At this point, after the last flit passes through and rewins the arbitration (with no competition), the $Glue_0$ bit (which is now 0) finally goes through L8 and thus no longer inverts any $Req_1$ request. So, if $Req_1$ was there all along, or arrived even recently, then finally the right input of the mutex becomes 1. But this happens only after the mutex has been won for the left interface on the last flit (with glue0 set to 0). So, during the processing of this last flit, but after the mutex gives $Req_0$ its last win, the right mutex input can finally go to its unsuppressed request value. The same scenario occurs, mutatis mutandis, for $Glue_1$.

One distinct challenge in designing an asynchronous arbitration primitive is that, unlike synchronous design, competing request inputs arrive in continuous time. The asynchronous primitive must be able to select between competing requests that may arrive simultaneously or separated by large intervals. This functionality, as discussed above, is performed by the mutual exclusion element (mutex), which can be an analog arbiter circuit. The mutex grants access to a shared resource (storage latches) to exactly one of two competing requests.

The discussion below recapitulates certain aspects of the arbitration primitive and discusses an alternative design, certain optional features, variations, and enhancements that may be included. The arbitration primitive was designed to achieve the goal of low latency and high throughput. The arbitration primitive can be thought of as two functional components combined to form a single "merge-with-arbitrate" primitive: an arbiter and a merge-without-arbitration (MWA) element.

The arbiter component takes two inputs and allows only one, the winner, to pass to its respective output in a given operation. The losing input must wait until it is permitted to advance by the arbiter. The merge-without-arbitration component combines two input streams into a single output stream, on the condition that the inputs are already guaranteed to be mutually exclusive. Namely, a transaction on one port must fully complete before a request can appear on the other port. Since the arbiter component guarantees mutually exclusive activity at its output, the two can naturally be combined to form an initial version of the desired composite arbitration primitive.

There are two arbitration primitive designs discussed in the follow section: the "throughput-oriented primitive" (TPP) and the "latency-oriented primitive" (LP) (which was discussed above with respect to FIGS. 5 and 6). The TPP provides a faster acknowledgment on the input channels than LP, which may improve throughput for certain input conditions, however it uses more area, power, and has longer forward latency. The LP reduces the area, power and forward latency required in the TPP design, but may have worse cycle time when accepting successive packets from a single port. Different applications may benefit from using either of the alternative designs.

Figure 7:
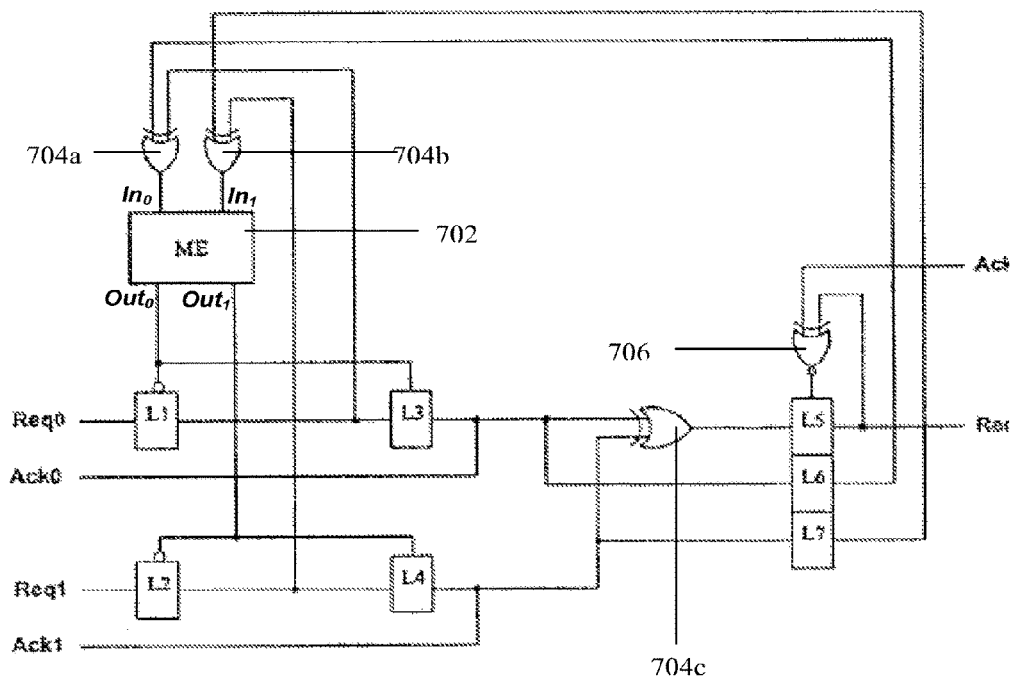
FIG. 7 is a block diagram illustrating a control circuit of a "throughput-oriented primitive" (TPP) arbitration primitive in accordance with an embodiment of the disclosed subject matter.

As shown in FIG. 7, the architecture of the TPP features seven transparent D-latches (numbered L1 through L7). Latches L1, L2, L5, L6, L7 are all normally transparent (enabled). Latches L3 and L4 are normally opaque (disabled).

There is a mutual exclusion element (ME), or mutex, 702 that performs the arbitration functionality. The mutex is a four-phase, return-to-zero module that operates as follows: (1) Initially both inputs ($In_0$ and $In_1$) and outputs ($Out_0$ and $Out_1$) are low; (2) Then one (or both) input wire(s) (e.g., $In_0$) transition to high, signaling request(s); (3) Next, exactly one (e.g, $Out_0$) of the outputs transitions high, corresponding to the winning request; (4) After some time, the winning wire (e.g., $In_0$) transitions low, signaling the end of the transaction; (5) Finally, the corresponding (e.g, $Out_0$) transitions low, returning the mutex to its initial state.

During the time the output wire is high ($Out_0$ in this example), a request may arrive (or disappear) on the other input port ($In_1$ in this example), but will have no effect on the state of the mutex 702. After a transaction is completed, the next transaction may begin immediately. In addition to the latches and mutex, three XOR gates 704a, 704b, 704c are used as merge elements for transition-signaling wires and an XNOR gate 706 is used as a latch control.

The TPP arbitration primitive operates as follows. Initially, all inputs and outputs are low. The mutex 702 has no pending requests, indicating that both mutex output wires are low. L3 and L4 are opaque, since mutex outputs are low, and are outputting low. All other latches are transparent (enabled), with output low. Therefore, all signal wires are low, except for the XNOR latch control output, which is high, enabling L5, L6, and L7.

Req$_0$ transitions from low to high, indicating the start of a transaction. Since L1 is transparent, Req$_0$ passes through (L2 is also transparent). It is halted at the input of L3, which is currently opaque. Req$_0$ continues to the input of the XOR 704a, which causes a transition at its output, generating a request to the mutex 702. Since there are no competing requests, the mutex 702 responds with a transition from low to high on its output (Out$_0$) corresponding to Req$_0$.

The rising acknowledgment wire performs two actions in parallel: (1) it closes L1, latching the current value of Req$_0$ and (2) opens L3, allowing Req$_0$ to pass through. The opening of L3 spawns three concurrent threads in the primitive: (1) L3 output is used as an acknowledgment (Ack$_0$) to the previous stage; (2) the same output continues through a transparent L6, causing a transition on the XOR 704a at the mutex 702 input, and resetting the mutex 702; (3) it causes a transition on the XOR 704c output at the input of L5, which it turn passes through L5, becoming Req to the next stage, as well as closing the L5-7 latches through the feedback loop of the XNOR 706 control.

At this point, that input to the mutex that was high is now de-asserted, so the mutex lowers its corresponding output, completing its return-to-zero protocol. As a result, L1 becomes transparent and L3 is made opaque again. The primitive can now accept a second request on Req$_0$ through the transparent L1 latch. Note that at any time during this simulation, Req$_1$ is free to transition and make a request to the mutex 702. L2 remains transparent and the request can get all the way to the input of the mutex 702, but will be stopped at the input of L4, which provides protection to the MWA stage. An interesting property that results from this behavior is that the request on the opposing port will win the mutex 702 as soon it is reset as part of the first transaction. In a heavily loaded scenario, the mutex 702 defaults to a toggling behavior that alternating between incoming requests.

Shortly after the Req transitions, L5-7 are made opaque, retaining their values. The Req transition will eventually be acknowledged by the next stage by a transition on Ack, which will open L5-7, allowing new values to pass through. Note that a new input transaction can begin even if there is no acknowledgment from the right environment.

The primitive can complete two full transactions with the left environment when there is a stalled right environment. This is due to the fact that an acknowledgment to the left environment (Ack$_0$ or Ack$_1$) is generated early in the cycle, at the opening of L3 or L4. In the case where two input request signals (Req$_0$ and Req$_1$) occur simultaneously, the mutex will generate only one acknowledgment, and the operation will continue as described above.

Figure 8:
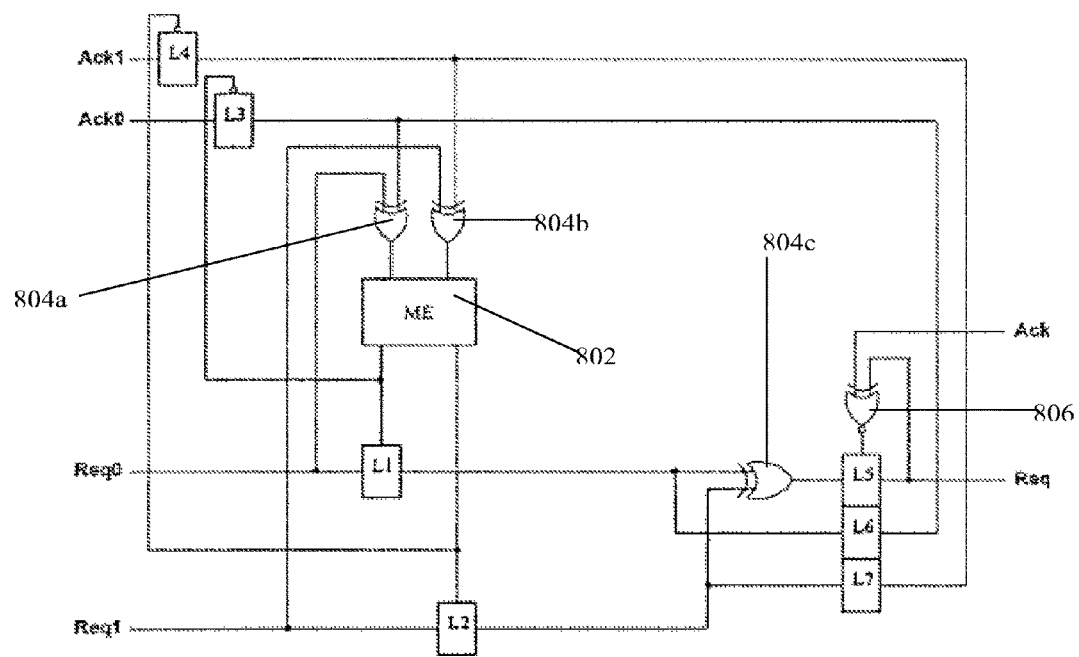
FIG. 8 is a block diagram illustrating a control circuit of a "latency-oriented primitive" (LP) arbitration primitive in accordance with an embodiment of the disclosed subject matter.

As shown in FIG. 8, the architecture of the Latency-Oriented Primitive (LP) features seven transparent D-latches (numbered L1 through L7). Note that the forward input-to-outputs paths now each have one fewer latch than the previous TPP design, while latches are now added to the left Ack$_0$ and Ack$_1$ paths.

Latches L3, L4, L5, L6, L7 are all normally transparent (enabled). Latches L1 and L2 are normally opaque (disabled). There is a mutual exclusion element (ME) 802, which executes the same four-phase return-to-zero protocol described in the previous section. Like the TPP design, three XOR gates 804a, 804b, 804c are used as merge elements for transition-signaling wires and an XNOR gate 806 is used as a latch control. The core structure of the TPP is preserved in this design, with two of the D-latches relocated.

Initially, all inputs and outputs are low. The mutex 802 has no pending requests, indicating that both mutex output wires are low. L1 and L2 are opaque, since mutex 802 outputs are low, and are outputting low. All other latches are transparent (enabled), with output low. Therefore, all signal wires are low, except for the XNOR 806 latch control output, which is high, enabling L5, L6, and L7.

Req$_0$ transitions from low to high, indicating the start of a transaction. It is halted at the input to L1, since the latch is opaque. Req$_0$ also continues to the input of the XOR 804a, 804b, which causes a transition at its output, generating a request to the mutex. Since there are no competing requests, the mutex responds with a transition from low to high on its acknowledgment output corresponding to Req$_0$.

The rising acknowledgment wire performs two actions in parallel: (1) it opens L1, allowing Req$_0$ to pass through, and (2) closes L3, latching the current value of Ack$_0$. The opening of L1 performs three operations in the primitive: (1) L1 output continues through a transparent L6, causing a transition on the XOR 804a, 804b at the mutex input, and resetting the mutex 802; (2) the same L1 output appears at L3 input, which is currently opaque; (3) it causes a transition on the XOR 804c output at the input of L5, which it turn passes through L5, becoming Req to the next stage, as well as closing the L5-7 latches through the feedback loop of the XNOR control.

At this point, the mutex 802 lowers its acknowledgment output, completing its return-to-zero protocol. As a result, L3 becomes transparent and L1 is made opaque. The opening of L3 causes a transition on its output, generating Ack$_0$ to the left environment, and completing the transaction. Note that at any time during this simulation, Req$_1$ is free to transition and make a request to the mutex 802. L2 remains opaque the entire time, preventing Req1 from entering the MWA stage. An interesting property that results from this behavior is that the request on the opposing port will win the mutex 802 as soon it is reset as part of the first transaction. In a heavily loaded scenario, the mutex 802 defaults to a toggling behavior that alternating between incoming requests.

There are two basic operations that must take place on the datapath: (1) one of the two Data inputs must be selected to advance and (2) data must be latched to prevent overrun from the previous stage. The selection operation is performed by a multiplexer, with some logic to generate the select input.

Figure 9:
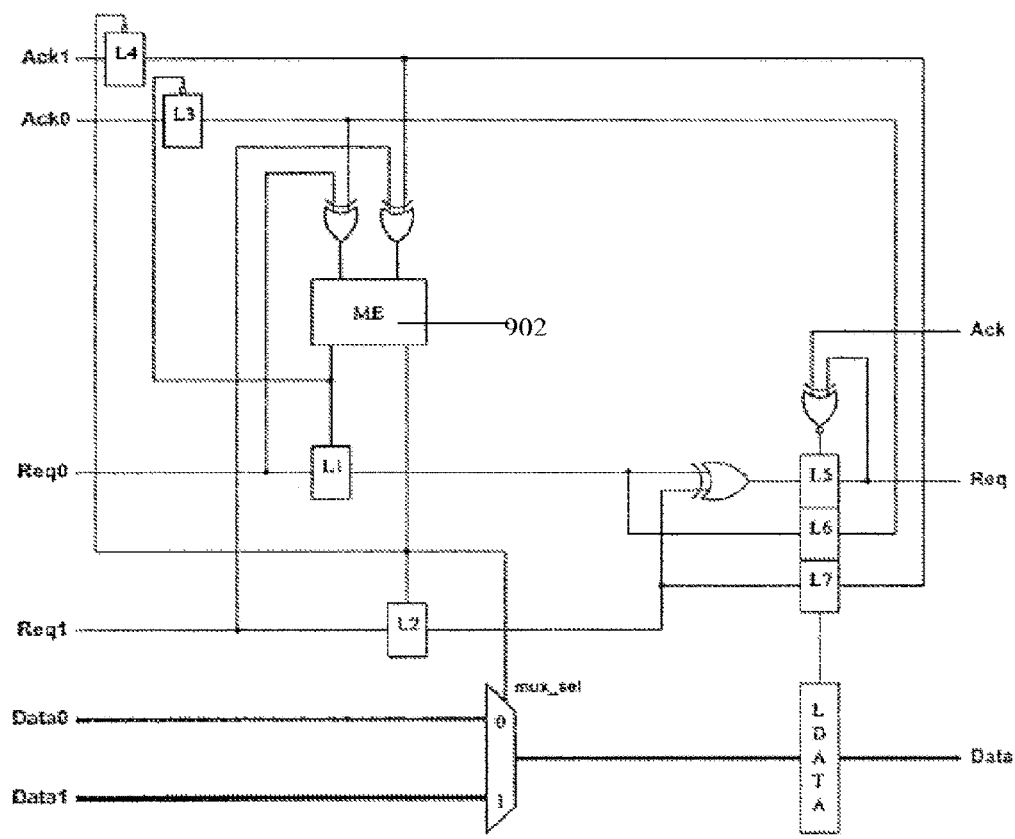
FIG. 9 is a block diagram illustrating an LP arbitration primitive in accordance with an embodiment of the disclosed subject matter.

FIG. 9 shows the LP design with added datapath. The second output of the mutex (ME) 902 is chosen for the multiplexer select input (mux_select). If the Req$_0$ input wins the mutex 902, then mux_select will remain low, allowing Data$_0$ to advance. If the Req$_1$ input wins the mutex 902, then mux_select will transition to high, allowing Data$_1$ to advance. There is a timing constraint introduced in the design that challenges the bundling between selected data and the input to L5.

The following are enhancements to the TPP and LP designs that address the areas of power consumption, added functionality, and initialization. The discussion below refers to FIGS. 9-11, which show variations of the LP design, and FIGS. 12 and 13, which show variations of the TPP design.

Power Optimization:

Since the majority of cells in the primitives are on the datapath, reducing unnecessary transitions can deliver significant power savings. The datapath logic includes multiplexers and transparent latches. The multiplexers select between the two data inputs, Data$_0$ and Data$_1$, and provide input to the data latches. The multiplexer selection signal, mux_select, is the focus of this optimization. Earlier designs of the latch-based mux_select for the arbitration primitive allowed the selection signal to transition multiple times during an operation. The power optimization presented below limits the transitions to once per cycle, thus reducing unnecessary transitions on multiplexers and latches.

The design in FIG. 9 uses the second output from the mutex (ME) 902 directly as mux_select. While this is functionally correct, it is not power efficient because the mutex 902 is reset during each cycle of operation. Any request at the $Req_1$ port, will result in two transitions of mux_select. The first transition from low to high occurs when the mutex 902 acknowledges the request, and then another transition back to low occurs when the mutex 902 is reset.

This behavior can cause unnecessary transitions for the multiplexer outputs. In the case of consecutive packets arriving on the $Req_1$ port, the right bank of data latches may also experience extra transitions due to the mutex 902 being reset. If the packets are sufficiently spaced in time, a transparent bank of data latches on the right may propagate these transitions to future stages.

Figure 10:
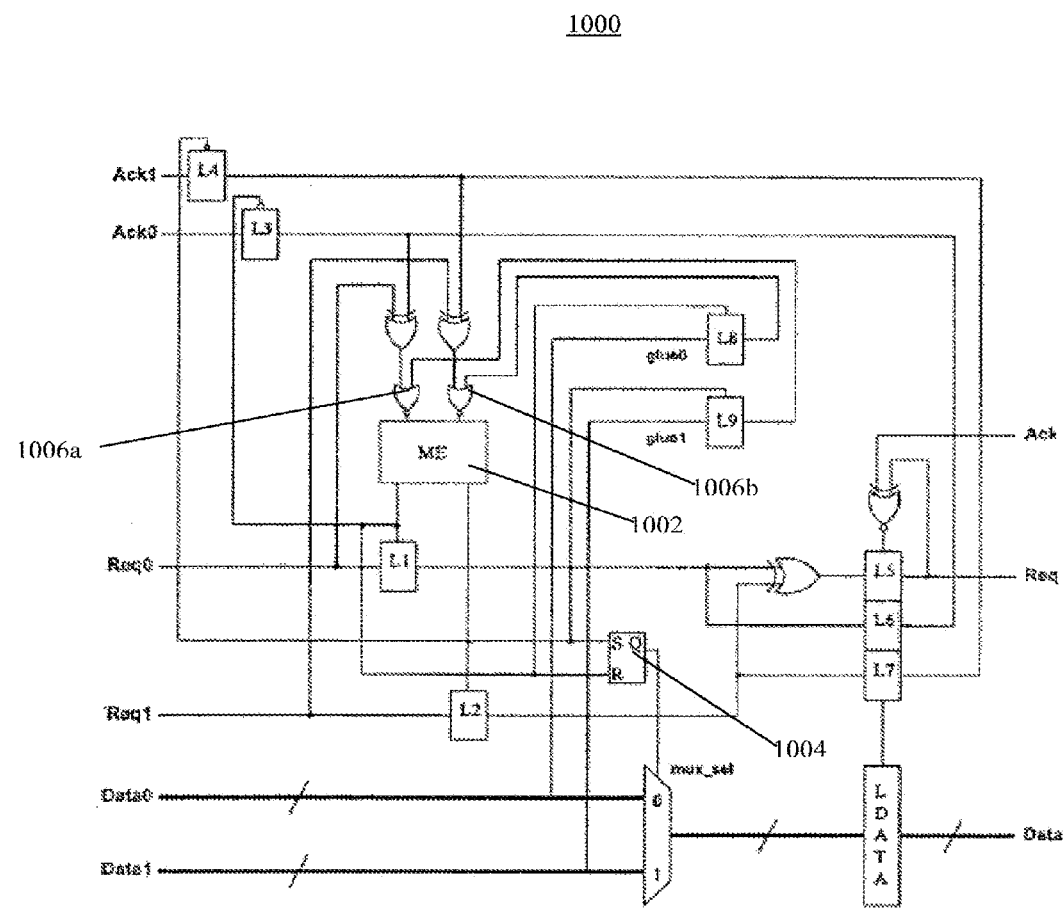
FIG. 10 is a block diagram illustrating an LP arbitration primitive with multi-flit capability, in accordance with an embodiment of the disclosed subject matter.

To eliminate this problem, an SR latch 1004 is introduced to drive mux_select, as shown in FIG. 10. The set (S) and reset (R) inputs are connected to the second and first outputs of the mutex, respectively. When a request wins the mutex 1002, the correct value of mux_select will appear at the output of the SR latch 1004. When the mutex 1002 is reset (with both outputs low), the SR latch 1004 output will keep the same state.

Multi-Flit Capability:

As discussed above with respect to FIG. 6, in many architectures, network packets may have different sizes. The interconnection network, however, has a fixed width for a specific implementation. Rather than designing a network for the widest packet, which wastes bandwidth when narrower packets are sent, wide packets can be sent as a series of narrow packets, called flits. To ease the process of reconstructing the original packet at the destination, the entire multi-flit packet remains intact within the network, traveling one after the other, uninterrupted.

The earlier designs performed arbitration on individual packets that did not guarantee the order in which packets would advance through the fan-in tree. The goal of this enhancement is to bias the arbitration decision in a primitive to allow an entire multi-flit packet to advance intact through the fan-in tree of the network.

One packet is defined as one or more flits, where a flit is the smallest granularity of data that can be sent through the network. In a multi-processor, for example, a flit may contain one word (32 bits) of data, routing address, plus some extra bits used by the processor. The load word (lw) command of the processor may require one flit per packet, the requested address, while the store word (sw) command may require two flits, one for destination address and one for data. In the earlier arbitration primitive designs, reordering was free to occur within the fan-in tree, since arbitration has no explicit bias towards selecting one request from another. In order to accommodate multi-flit packets, hardware is added to detect and implement the multi-flit protocol.

FIG. 10 shows the proposed enhanced design for LP with multi-flit capability. Each flit now contains an extra bit, called the glue bit, to denote whether the following flit on the same port is part of the same packet. A multi-flit packet, therefore, is defined as a series of flits with glue bit equal to one, followed by one flit with glue bit equal to zero. This definition is useful for a couple of reasons. First, defining a multi-flit packet in a distributed fashion, on a per-flit basis, simplifies the hardware. Second, by adding this functionality, the network can handle any size of packet that an application requires.

In order to bias the selection of the mutex 1002 and to guarantee that the next flit of a multi-flit packet can advance, a method is used to eliminate the competition. When the first flit of a multi-flit packet wins the mutex 1002, the opposing request input to the mutex 1002 is forced to zero, or "killed". This either prevents future requests on the other port from occurring, or in the case where a request was already pending, kills the opposing request until the entire multi-flit packet has passed through the arbitration primitive. While the mutex has acknowledged one request, another request on the opposing port can appear or disappear without affecting the operation. The kill function is achieved using a NOR gate 1006a, 1006b located at the input of the mutex 1002.

Once the mutex 1002 has made a new decision, based on the first-arriving flit of a multi-flit packet, one of the multi-flit latches, L8 or L9, is made transparent (enabled) by the corresponding mutex 1002 output. The input to the multi-flit latch is the glue bit from the corresponding Data input, which, if high, becomes a kill signal to the opposing request signal at the mutex 1002. When the mutex 1002 resets, the latch is closed. It is important that the glue bit reaches the NOR gate 1006a, 1006b input before the mutex 1002 is reset, so in the case of a multi-flit packet, a rival input will be killed, and the next flit to advance will be from the same input port. A rival request remains killed until after the final flit of the winning multi-flit packet wins the arbitration, at which time its glue bit value (which is now 0 to indicate the end of the multi-flit packet) results in removal of the kill signal from its rival at the mutex input. While the additional hardware is minimal (two transparent D-latches and two NOR gates), the NOR gates are on the critical execution path and do have some impact on performance Optimized Reset:

For correct operation, the arbitration primitive should be initialized so the latches are in the desired known state, the mutual exclusion element is reset, and request and acknowledgment outputs are de-asserted. The addition of initialization logic can hurt performance if added on critical paths and increases the area requirements of the design. The goal of this reset implementation is to provide the necessary functionality while minimizing the performance and area overheads. To accomplish this goal, a partial reset of control latches is implemented, with some minor logic additions on non-critical paths. This approach limits performance and area overheads and is sufficient to bring the primitive to the desired initial state.

Figure 11:
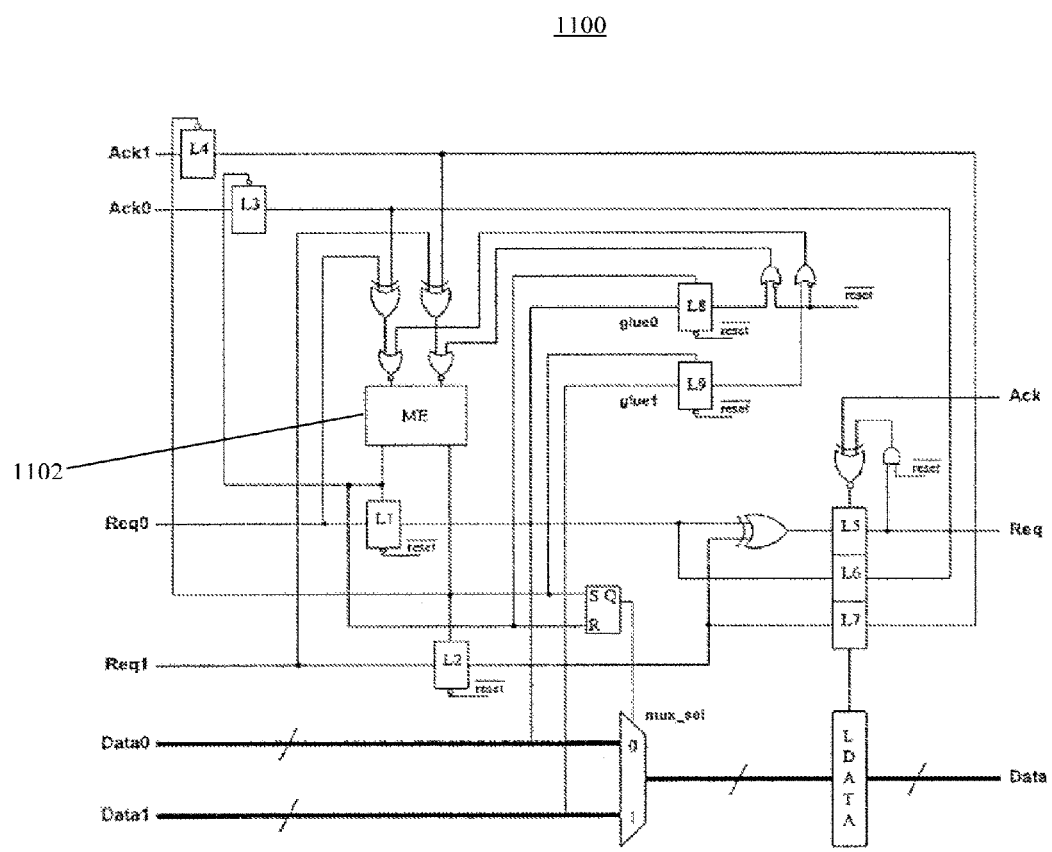
FIG. 11 is a block diagram illustrating an LP arbitration primitive with multi-flit capability and active-low reset, in accordance with an embodiment of the disclosed subject matter.

The arbitration primitive with added reset logic is shown in FIG. 11. This functionality is desirable at power-on, to guarantee that the fan-in tree is ready to accept new packets. A specific application may also find it useful to flush the network of all packets.

Reset is accomplished by setting the nine control latches to a known state with known output values. We do this in three parts: resetting the mutex 1102, modifying a partial set of latches enabled by the mutex 1102, and making the set of latches on the right initially transparent.

First, the mutex 1102 is reset by exploiting the kill your rival functionality implemented as part of multi-flit capability. The mutex 1102 outputs serve as latch enable signals for latches L1, L2, L3, L4, L8 and L9.

Next, the latches enabled by the mutex 1102 outputs are evaluated to decide which require an active-low asynchronous reset. Transparent latches with reset in the standard cell library have more delay, and require higher area and power. Therefore, the effect on performance will be minimized by using the minimum number of latches with reset. The latches controlled by the mutex 1102 outputs can be divided into two groups: initially enabled and initially disabled. Only the latches that are initially disabled require an active-low reset, since their output value will not be known. The initially disabled latches are L1, L2, L8, and L9. The initially enabled latches (L3 and L4) are transparent, and will propagate values from their input to output. By limiting the latches with active-low reset, we minimize the performance penalty. L1 and L2 are the only latches with reset on the critical path of the LP arbitration primitive.

Finally, latches L5, L6, and L7 are enabled by setting the feedback input of the XNOR to low (the Ack will also be low at reset). By enabling these latches, the deasserted outputs of L1 and L2 will: (1) deassert Req through the XOR and latch L5, (2) deassert $Ack_0$ and $Ack_1$ through L3 and L4 respectively, (3) reset the mutex XNOR controls, since request inputs $Req_0$ and $Req_1$ will also be deasserted at reset. This completes the optimized partial reset operation. When the reset signal transitions to high, the primitive will be in the initial state.

Figure 13:
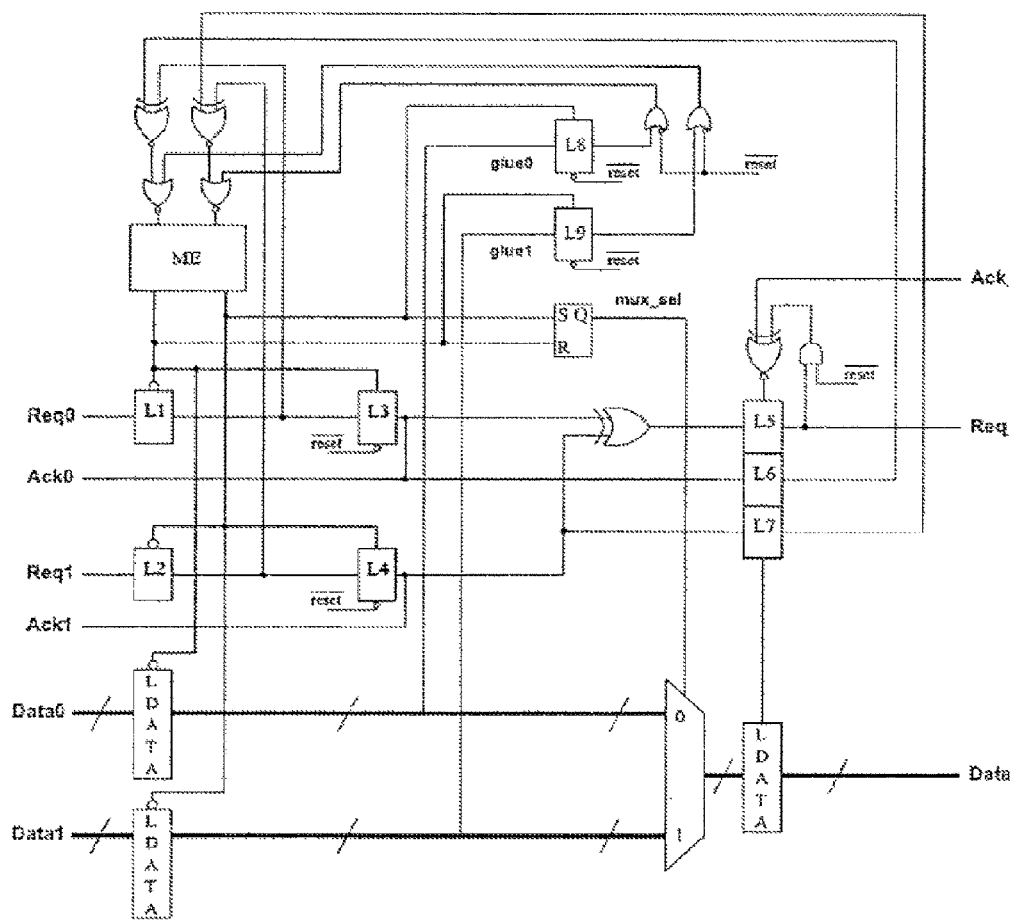
FIG. 13 is a block diagram illustrating a TPP arbitration primitive with multi-flit capability and active-low reset, in accordance with an embodiment of the disclosed subject matter.

The three enhancements discussed above, power optimization, multi-flit capability, and optimized reset, all apply to the TPP design as well (see FIG. 13, discussed below).

Figure 12:
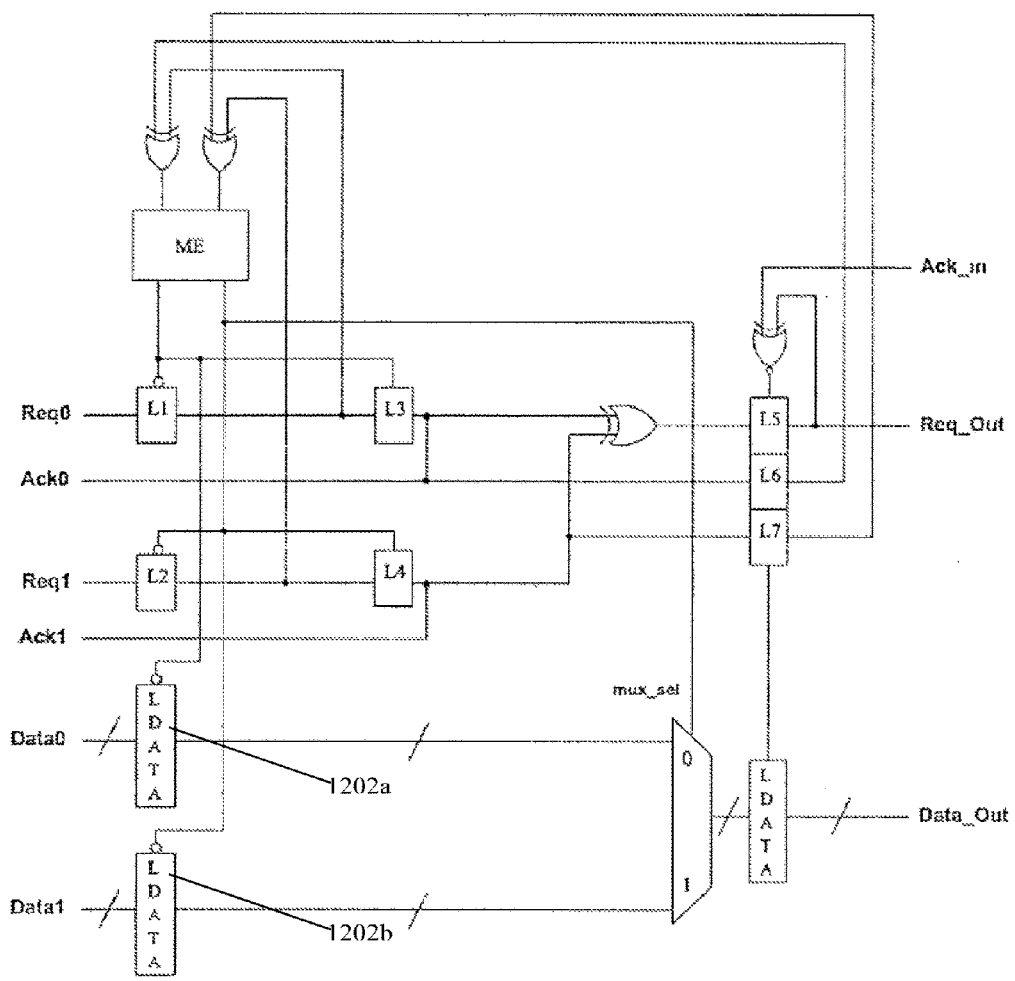
FIG. 12 is a block diagram illustrating the a TPP arbitration primitive in accordance with an embodiment of the disclosed subject matter.

FIG. 12 shows the TPP arbitration primitive data path configuration. Generally speaking, there are three possible locations for the multiplexing of the two data inputs: before the first level of data latches, in-between the two levels, or after. The early multiplexing introduces difficult timing constraints, though it has the lowest area overhead. The late multiplexing has timing constraints similar to mid, but requires an extra bank of data latches, increasing the area overhead. For the best balance of ease-of-design and area, the multiplexes can be placed in-between according to the mid configuration.

FIG. 12 shows the TPP design with mid multiplexing and data latches. Two banks of latches 1202a, 1202b are used to store $Data_0$ and $Data_1$ values. Latch L1 and the $Data_0$ latches 1202a share the same enabling signal, and are normally transparent. The same applies for L2 and $Data_1$ latches 1202b. The enhanced TPP arbitration primitive with power optimization, multi-flit capability and reset is shown in FIG. 13.

Primitive Circuit Performance:

Performance of primitive circuits is analyzed by looking at forward latency and cycle time. Latency is the delay through an empty primitive, and is important when looking at network performance for an initially empty network as well. Cycle time is the measure for operation under steady-state input conditions and reflects performance for a network with medium to high traffic. For cycle time, analytical equations for two distinct input patterns are created. The first case has packets arriving at the same input port, called the single port arbitration case. The second case has packets arriving at both input ports, called the alternating port arbitration case. Both the enhanced LP and TPP arbitration primitives are evaluated under these input conditions. The alternating port routing has better cycle time than the single port for both primitives due to concurrent operation between the two ports, and is described in detail below.

Timing constraints must be satisfied in order to guarantee correct operation of the routing primitive. These constraints specify some ordering of competing events and must be handled carefully in implementation. However, the timing constraints identified in the arbitration primitive are simple one-sided constraints that are not difficult in practice to satisfy.

Forward latency is the time it takes a data item to pass through an initially empty primitive. For the arbitration primitive, this is the time from an input Req transition ($Req_0$ or $Req_1$) to a corresponding Req transition. The path includes acquiring the mutex, and generating a new Req transition. Latency equations for LP (1) and TPP (2) are presented below.

$$L_{LP} = T_{XNOR\uparrow} + T_{NOR\uparrow} + T_{ME\uparrow} + T_{L1_{G \to Q}} + T_{XOR} + T_{L5_{D \to Q}} \quad (1)$$

$$L_{TPP} = T_{L1_{D \to Q}} + T_{XNOR\uparrow} + T_{NOR\uparrow} + T_{ME\uparrow} + T_{L3_{G \to Q}} + T_{XOR} + T_{L5_{D \to Q}} \quad (2)$$

Subtracting the two equations shows that the difference is one latch D→Q delay, and the reason LP is regarded as a latency-optimized primitive.

Cycle time is the time interval between successive flits passing through the primitive. A cycle of stage N consists of three events:

1. An Req transition is passed to the right environment and an Ack transition is returned.
2. Stage N resets the mutex, preparing for the next input.
3. An $Ack_0$ or $Ack_1$ transition is passed to the left environment and a input Req transition ($Req_0$ or $Req_1$) with new data arrives at stage N.

The arbitration primitives exhibit different behavior depending on input patterns. Namely, cycle times may be different if consecutive Reqs arrive at the same port versus arriving at alternating ports. The first case, which exercises a single port, may occur in a stage if many packets arrive from the same set of sources, also in the case of multi-flit packets. The alternating case is likely in situations with heavy load and contention, most notably at the root of the fan-in tree.

The cycle times for the various input patterns are now discussed. The variables in the equations refer to arcs in FIG. 14. The primitives operate concurrently, with multiple paths active at the same time. There are several synchronization points that require multiple threads to join in order to proceed. Each join is represented by a max expression in the cycle time equations. The longest of the joining paths will determine how execution continues, and ultimately affect the performance of the arbitration primitive.

In general, A paths, above the horizontal, are forward paths through the right environment, described above in (1). This path is shared by both input ports. B, D, and E paths are internal to the primitive, and deal with resetting and setting of the mutex. C paths, below the horizontal, are reverse paths that cycle through the left environment with acknowledgment and new request plus data, mentioned in (3).

Paths with subscript 0 and 1 describe transactions on ports 0 and 1, respectively. The equations for dual operating modes of the LP and TPP are now presented, followed by a brief analysis.

LP Single Port:

The cycle is measured as the amount of time between one rising edge of $ME_0$ output and the next, shown in FIG. 14(a). The equation describes one full cycle on port 0.

$$T_{LP\_Single} = \max(A, B_0 + C_0 + D_0 + E_0) \quad (3),$$

where $$A = T_{L5_{D \to Q}} + T_{RightEnv} + T_{XNOR},$$

$$B_0 = T_{L6_{D \to Q}} + T_{XNOR\downarrow} + T_{NOR\downarrow} + T_{ME0\downarrow},$$

$$C_0 = T_{L3_{G \to Q}} + T_{LeftEnv0} + T_{XNOR\uparrow} + T_{NOR\uparrow}, D_0 = T_{ME0\uparrow},$$
$$E_0 = T_{L1_{G \to Q}}, \text{ and}$$

$$F = T_{XOR}$$

TPP Single Port:

The cycle is measured as the amount of time between one rising edge of the $ME_0$ output and the next, shown in FIG. 14(b). The equation describes one full cycle on port 0.

$$T_{TPP\_Single} = \max(A, E_0 + \max(B_0, C_0) + G_0 + D_0) \quad (4),$$

where $$A = T_{L5_{D \to Q}} + T_{RightEnv}, T_{XNOR\uparrow}, B_0 = T_{L6_{D \to Q}} + T_{XNOR\downarrow} + T_{NOR\downarrow} + T_{ME_0\downarrow},$$

$$C_0 = T_{LeftEnv_0}, D_0 = T_{ME_0\uparrow}, E_0 = T_{L3_{G \to Q}}, F = T_{XOR}, \text{ and}$$

$$G_0 = T_{L1_{D \to Q}} + T_{XNOR\uparrow} + T_{NOR\uparrow}$$

LP Alternating Ports:

A full cycle when alternating is the amount of time between one rising edge of the $ME_{output}$ and the next, shown in FIG. 14(c). The subscripts indicate the port associated with the path. The figure shows a full cycle, with one transaction on port 0 and the next on port 1. The cycle time for one flit at steady state, therefore, is half of the full cycle time.

$$T_{LP\_Alternating} = \frac{1}{2} \cdot \max \begin{pmatrix} \max(E_0 + B_0 + D_0, C_1)), + \\ \max(E_1 + B_1 + D_1, C_0) \\ \max(A, B_0 + D_1 + E_1) + \\ \max(A, B_1 + D_0 + E_0) \end{pmatrix}, \quad (5)$$

where $$A = T_{L5_{D \to Q}} + T_{RightEnv} + T_{XNOR\uparrow},$$

$$B_0 = T_{L6_{D \to Q}} + T_{XNOR\downarrow} + T_{NOR\downarrow} + T_{ME_0\downarrow},$$

$$B_1 = T_{L7_{D \to Q}} + T_{XNOR\downarrow} + T_{NOR\downarrow} + T_{ME_1\downarrow},$$

$$C_0 = T_{L3_{G \to Q}} + T_{LeftEnv_0} + T_{XNOR\uparrow} + T_{XNOR\uparrow},$$

$$C_1 = T_{L4_{G \to Q}} + T_{LeftEnv_1} + T_{XNOR\uparrow} + T_{XNOR\uparrow}, D_0 = T_{ME_0\uparrow},$$

$$D_1 = T_{ME_1\uparrow}, E_0 = T_{L1_{G \to Q}}, E_1 = T_{L2_{G \to Q}}, \text{ and } F = T_{XOR}$$

TPP Alternating Ports:

A full cycle when alternating ports is the amount of time between one rising edge of the $ME_0$ output and the next, shown in FIG. 3.13(d). The subscripts indicate the port associated with the path. The figure shows a full cycle, with one transaction on port 0 and the next on port 1. The cycle time for one flit at steady state, therefore, is half of the full cycle time.

$$T_{TPP\_Alternating} = \frac{1}{2} \cdot \max \begin{pmatrix} S_A + S_B, \\ \max(E_0 + S_A + B_1 + S_C) + D_0, \\ \max(E_1, S_B + B_0 + S_D) + D_1 \end{pmatrix}, \quad (6)$$

where $$A = T_{L5_{D \to Q}} + T_{RightEnv} + T_{XNOR\uparrow}, B_0 = T_{L6_{D \to Q}} + T_{XNOR\downarrow} + T_{NOR\downarrow} + T_{ME_0\downarrow},$$

$$B_1 = T_{L7_{D \to Q}} + T_{XNOR\downarrow} + T_{NOR\downarrow} + T_{ME_1\downarrow}, C_0 = T_{L3_{G \to Q}} + T_{LeftEnv_0},$$

$$C_1 = T_{L4_{G \to Q}} + T_{LeftEnv_1}, D_0 = T_{ME_0\uparrow}, D_1 = T_{ME_1\uparrow}, E_0 = T_{L3_{G \to Q}} + T_{XOR},$$

$$E_1 = T_{L4_{G \to Q}} + T_{XOR}, F = T_{XOR}, F_0 = T_{L1_{D \to Q}} + T_{XNOR\uparrow} + T_{NOR\uparrow},$$

$$F_1 = T_{L2_{D \to Q}} + T_{XNOR\uparrow} + T_{NOR\uparrow}, S_A = \max(A, B_0 + D_1 + E_1),$$

$$S_B = \max(A, B_1 + D_0 + E_0), S_C = E_0 + C_0 + G_0, \text{ and}$$

$$S_D = E_1 + C_1 + G_1$$

Figure 14:
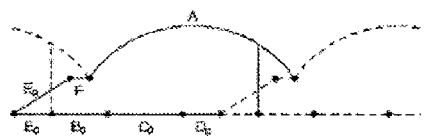
FIG. 14 shows diagrams of arbitration primitive cycle times in accordance with an embodiment of the disclosed subject matter.
Figure 14:
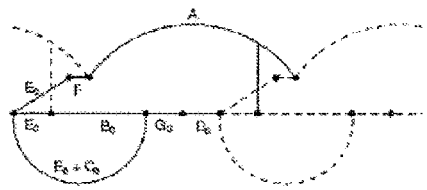
Figure 14:
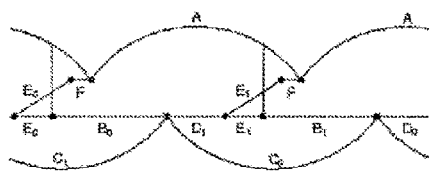
Figure 14:
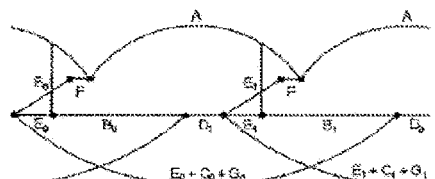

Several conclusions can be drawn based on the diagrams in FIG. 14 and the equations 3 through 6. First, given a very slow right environment, all the cycle times evaluate to A. In the case of a slow left environment, which equates to light traffic in the network, the reverse paths, C, will dominate the cycle time. Both of these behaviors are expected in an handshaking pipeline, where each stage is dependent on receiving requests from the left and acknowledgments from the right.

Another interesting case is a very fast right environment and a very fast left environment. In this case, LP_Single operates very serially, evaluating to B+C+D+E. The cycle consists of acquiring the mutex, resetting it, then waiting for a new request from the left. The TPP_Single case, which has some concurrency between internal and reverse paths, will evaluate to G+D+E+B, cycling between accepting new data, acquiring the mutex, and resetting it. TPP will have better throughput than LP in this situation, benefiting from the early acknowledgment to the left.

The most interesting result in the analyzing the fast environments case is that TPP and LP both perform the same for alternating inputs, each evaluating to B+D+E for both ports. In nodes close to the root of the fan-in tree, where contention is more likely, this behavior can be exhibited, making both TPP and LP good candidates for the root primitive.

It is important to note that even under heavy load and a fast right environment, the single-port performance may be relevant, such as in the case of multi-flit packets. Given a very fast right environment, TPP will outperform LP in handling multi-flit packets, since each will operate according to their respective single-port equations while in multi-flit mode. But depending on the frequency of multi-flit packets in the traffic, this may not be the common case.

There are four timing constraints that must be satisfied for the correct operation of the primitive.

Input Bundling Constraint:

There is a bundling constraint on the data input channels. The bundled data communication protocol, specifies that new, stable data should arrive at the input before the request transition. The request transition ($Req_0$ or $Req_1$) then asserts validity for the data, as well as begins the transfer of data from one stage to the next.

Fast Reset of Mutex:

There is a race condition between the setting of multi-flit mode and the resetting of the mutex for the next cycle. This mostly applies to the case where the right bank of data latches is transparent when the mutex asserts a new decision. Once the mutex raises an acknowledgment, in order to guarantee correctness, the multi-flit "kill" signal must be asserted or de-asserted before the mutex can be reset. This ends up being a simple constraint to satisfy:

$$T_{Latch_{G \to Q}} + T_{Latch_{D \to Q}} + T_{XNOR\downarrow} + T_{NOR\downarrow} > T_{Latch_{G \to Q}} + T_{NOR}, \text{ where } T_{Latch_{D \to Q}} + T_{XNOR\downarrow} > 0$$

This constraint applies to both LP and TPP primitives. For LP, this must hold for (L1, L6, L8) or (L2, L7, L9) used as the latches in the first equation. For TPP, substitute (L3, L6, L8) or (L4, L7, L9) for the latch terms in the first equation. This constraint should be met even with the addition of OR gates at the outputs of L8 and L9.

Output Bundling Constraint:

Another timing constraint is a bundling constraint on the right bank of data latches, when they are transparent prior to a mutex decision. After a decision is made by the mutex, the winning Req continues through L5, where it is fed back to the XNOR latch control in order to close the right bank of latches. During this time, the correct data must be passed through the multiplexes and data latches, so the correct values are present when the latches are disabled, storing the data.

$$T_{Latch_{G\to Q}} + T_{XOR} + T_{L5_{D\to Q}} + T_{XNOR\downarrow} > T_{SRLatch} + T_{MUX} + T_{LData_{D\to Q}},$$

where $$T_{Latch_{G\to Q}} + T_{XOR} + T_{XNOR\downarrow} > T_{SRLatch} + T_{MUX}$$

The first latch variable may be (L1, L2) for LP or (L3, L4) for TPP.

Data Overrun in TPP Latches:

The final constraint appears only in TPP and concerns the L1 and L3 (or L2 and L4) latch enables. Since they are controlled by the same latch enable, the mutex output, there is a chance for data overrun when L1 is being opened and L3 is being closed.

$$T_{L1_{G\to Q}} > T_{hold_{L3}}$$

As long as the paths from mutex output are relatively matched, this should be easy to satisfy. The gate-to-output delay through the latch usually will exceed the hold time.

Performance of routing primitives may be analyzed by looking at forward latency and cycle time. Latency is the delay through an empty primitive, and is important when looking at network performance for an initially empty network as well. Cycle time is the measure for operation under steady-state input conditions and reflects performance for a network with medium to high traffic. For cycle time, analytical equations for two distinct input patterns are created. The first case has consecutive packets routed to the same destination, called the single port routing case. The second case has consecutive packets routed different destinations, called the alternating port routing case. The alternating port routing has better cycle time than the single port due to the concurrent operation of the two ports, and is described in detail below.

Forward latency is the time it takes a data item to pass through an initially empty primitive. For the routing primitive 200, this is the time from a Req transition to a corresponding $Req_0$ or $Req_1$ transition with valid data on the output channel. The example path is for data directed to port 0. The path consists of asserting w, $y_0$, then, in parallel, a transition on the Toggle element 302 and opening of corresponding data latches 204a, 204b. Note that this path assumes that new data and a stable B signal were already present at the inputs of the primitive.

$$L = T_{XOR_{W\uparrow}} + T_{AND_{Y0\uparrow}} + \max(T_{Toggle0}, T_{AND\uparrow} + T_{Latch})$$

Cycle time is the time interval between successive packets passing through the primitive. A cycle consists of three events:

1. A $Req_0$ or $Req_1$ transition is passed to the right environment and a corresponding $Ack_0$ or $Ack_1$ transition is returned.
2. The latches are shut and the latch controller is reset, preparing for the next input.
3. An Ack transition is passed to the left environment and a Req transition with new data and B arrives at the input.

Figure 15:
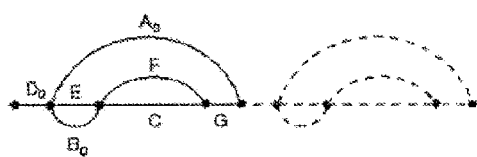
FIG. 15 shows cycle time diagrams for routing primitives in accordance with an embodiment of the disclosed subject matter.
Figure 15:
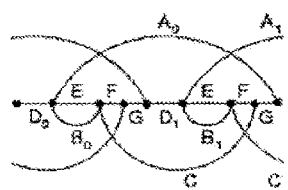

The routing primitive exhibits significantly different behavior depending on input patterns. Namely, cycle times may be different if consecutive packets are destined for alternating destinations. This is due to the fact that while one port is awaiting acknowledgment, the other is free to complete a full transaction. FIG. 15 shows graphs representing the two types of cycle times. The variables in the equations correspond to arcs in the figure.

The primitives operate concurrently, with multiple paths active at the same time. There are several synchronization points that require multiple threads to join in order to proceed.

Each join in FIG. 15 is represented by a max expression in the cycle time equations. The longest of the joining paths will determine how execution continues, and ultimately affect the performance of the routing primitive.

In general, A paths, above the horizontal, are forward paths through the right environment, described above in the first of the three cycle events. B, D, E, and F paths are internal to the primitive, and deal with setting and resetting the latch controller. C paths are reverse paths that cycle through the left environment with acknowledgment followed by new request plus data, mentioned in the third of the three cycle events.

Paths with subscript 0 and 1 describe transactions on ports 0 and 1, respectively. The equations for cycle time are now presented for two simulation cases: successive routing to a single port and successive routing to alternating ports.

Successive Routing to Single Port:

The cycle is measured as the amount of time between transition of $Req_0$ and the next, shown in FIG. 15(a). The equation describes one full cycle on port 0 (input B=0). The equation is the same for port 1, exchanging 0 for 1 in the subscripts.

$$T_{Single} = D_0 + \max(A_0, \max(B_0, E) + \max(C, F) + G), \text{ where}$$

$$A_0 = T_{RightEnv_0} + T_{XNORX_0\uparrow}, B_0 = T_{XNORX_0\downarrow}, C = T_{LeftEnv}$$

$$D_0 = T_{AND_{Y0\downarrow}} + T_{Toggle0}, E = T_{XOR_{Ack}}, \text{ and } G = T_{XOR_{W\uparrow}}.$$

Successive Routing to Alternating Ports:

A full cycle of alternating ports is time between one transition of Req0 and the next, shown in FIG. 15(b). The equation describes two full cycles, one to port 0 immediately followed by one to port 1. The cycle time for a single flit in steady state is therefore half.

$$T_{Alternating} = \frac{1}{2} \cdot \max\begin{pmatrix} D_0 + \max(A_0, S_A + \max(S_C, C) + G), \\ D_1 + \max(A_1, S_B + \max(S_D, C) + G) \end{pmatrix},$$

where $$A_0 T_{RightEnv_0} + T_{XNORX_0\uparrow}, A_1 = T_{RightEnv_1} + T_{XNORX_1\uparrow},$$

$$B_0 = T_{XNORX_0\uparrow}, B_1 = T_{XNORX_1\downarrow}, C = T_{LeftEnv},$$

$$D_0 = T_{AND_{Y0\downarrow}} + T_{Toggle0}, D_1 = T_{AND_{Y1\uparrow}} + T_{Toggle1},$$

$$E = T_{XOR_{Ack}}, F = T_{XOR_Q}, G = T_{XOR_{W\uparrow}},$$

$$S_A = \max(B_0, E), S_B = \max(B_1, E),$$

$$S_C = F + G + D_1 + S_1 + F, \text{ and}$$

$$S_D = F = G = D_0 = S_0 + F.$$

The single port cycle is highly serial and requires all operations to complete for each cycle, before the next cycle can begin. The alternating port case allows for concurrency between adjacent cycles, improving performance.

In the case of a slow right environment, the single port case evaluates to D+A, while the alternating case evaluates to ½(D+A) on average. This is expected, since while awaiting an acknowledgment one port, the other is free to complete multiple full transactions.

For the case of both environments operating very quickly, both scenarios evaluate to D+max(B, E)+F+G. With fast responses from the right environments, the routing primitive can operate very efficiently, but as acknowledgments are generated with longer latency, the performance for the single port case quickly falls far behind. Therefore, the key to good performance at the root, which is critical for tree performance, is either generating fast acknowledgments from following stages or biasing the input packets to arrive with alternating destinations.

There are two simple, one-sided timing constraints that are must be satisfied in order to guarantee correct operation. The first is a bundling constraint on the input port, specifically regarding the B input. This signal is used as the routing decision for the data packet and should be stable when a Req transition occurs. Since B is part of the data packet, this should be guaranteed as part of a general bundling constraint. The second constraint is on the toggle element, if a T latch is used to implement it. The desired functionality is that the correct toggle element will toggle once for a corresponding Req. Since a T latch will continue to oscillate when enabled, it must be disabled after the first transition and before the second can occur.

$$T_{ToggleFeedback} > T_{XNOR} + T_{AND}$$

To accomplish this, the feedback loops in the T-latch must have adequate delay.

Figure 16:
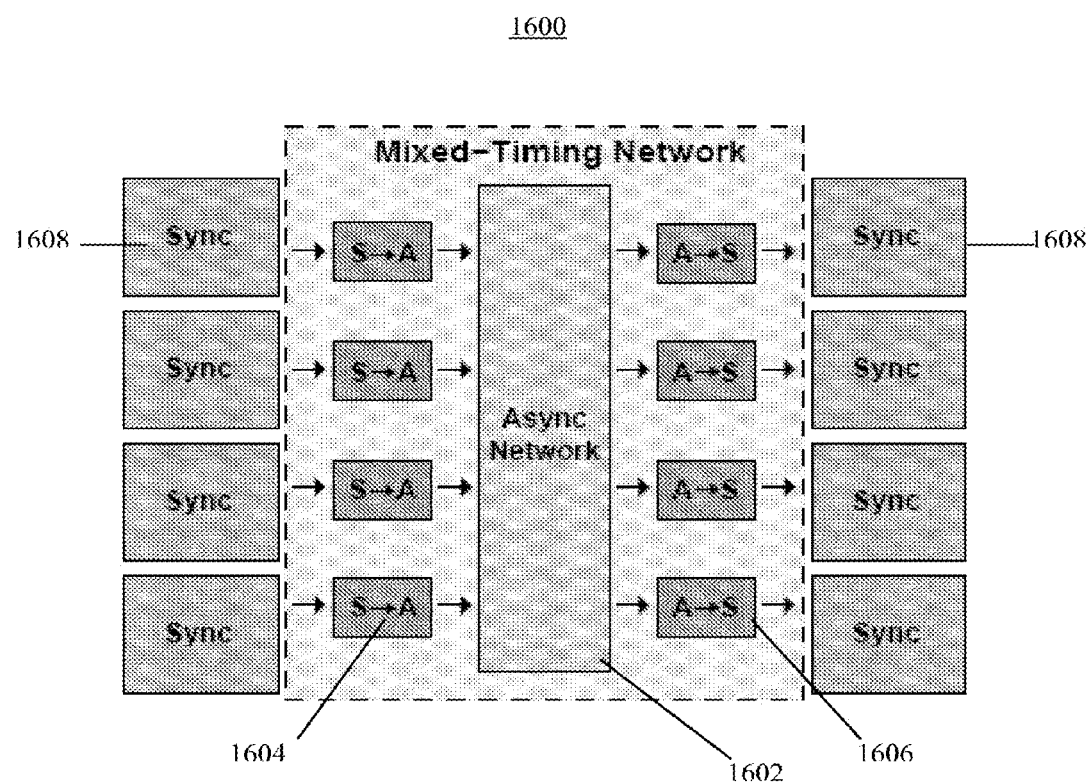
FIG. 16 is a block diagram illustrating a mixed-timing network including routing and arbitration nodes, in accordance with an embodiment of the disclosed subject matter.

FIG. 16 illustrates a mixed-timing network 1600 that includes a core asynchronous network 1602 surrounded by mixed-timing interfaces 1604, 1606. The mixed-timing network 1600 provides fine-grained pipelined integration of synchronous components 1608 in a globally-asynchronous locally-synchronous (GALS) style architecture. In some embodiments, the synchronous components 1608 may be processing cores. In some embodiments, the synchronous components 1608 may be functional units or memory modules. To support scalability, synchronous components 1608 may have arbitrary unrelated clock rates.

Figure 17:
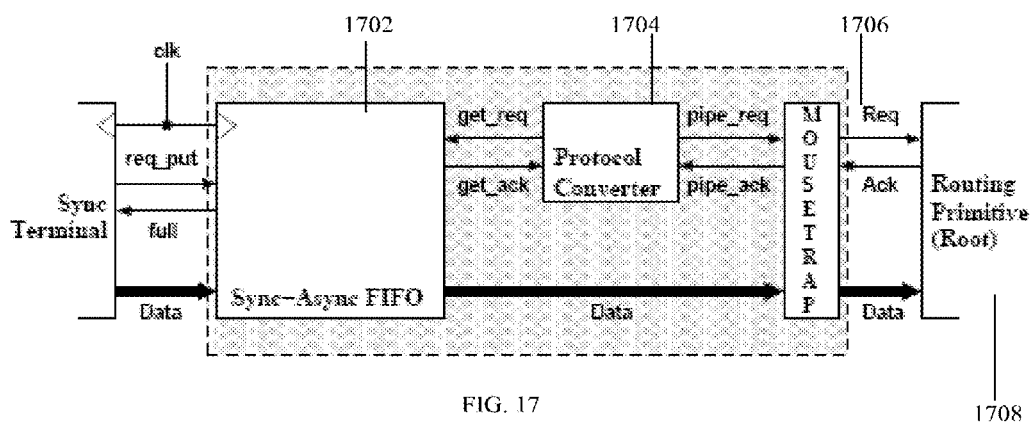
FIG. 17 is a block diagram illustrating a synchronous-to-asynchronous interface circuit in accordance with an embodiment of the disclosed subject matter.
Figure 18:
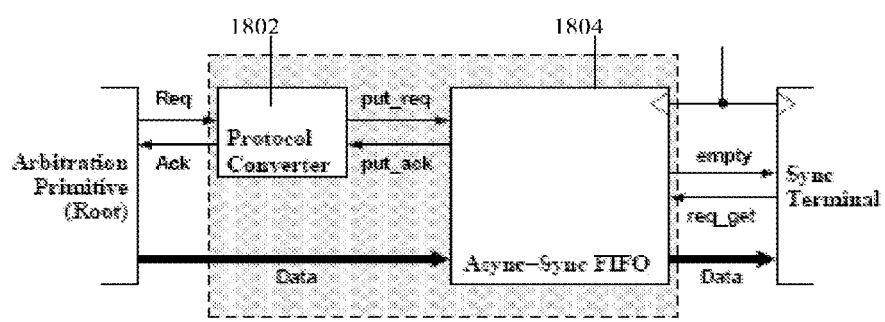
FIG. 18 is a block diagram illustrating an asynchronous-to-synchronous interface circuit in accordance with an embodiment of the disclosed subject matter.

FIGS. 17 and 18 illustrate the mixed-timing interfaces. FIG. 17 shows a Synchronous-to-Asynchronous Interface 1700 and FIG. 18 shows a Asynchronous-to-Synchronous Interface 1800. The mixed-timing interfaces 1700, 1800 are designed using a mixed-timing FIFO 1702, 1802 and an asynchronous protocol converter 1704, 1804. Each mixed-timing FIFO is a token ring of identical storage cells that have data enqueued from one timing domain and dequeued from another. The synchronous portions of the FIFOs have full or empty detectors. Detection circuits (not shown) generate signals to stall synchronous terminals in order to prevent overrun or under-run conditions in the FIFO.

The asynchronous portions do not require explicit full or empty detection, as they will simply withhold acknowledgment until an operation can be performed. The mixed-timing interfaces 1700, 1800 provide communication between synchronous terminals and the asynchronous network.

The protocol converter 1704, 1804 translates handshaking signals between the two-phase transition signaling of the asynchronous network and the four-phase return-to-zero signaling of the existing mixed-timing FIFO. To improve throughput, a MOUSETRAP pipeline stage 1706 is added to the Synchronous-to-Asynchronous Interface 1700 between the protocol converter 1704 and the routing primitive 1708 at the root of a fan-out tree. The MOUSETRAP stage, when empty, will store new data and acknowledge the mixed-timing FIFO faster than the routing primitive.

The pipeline primitive accepts data from the left and forwards it to the right. MOUSETRAP stages can also be added for boosting performance, since they provide a fast acknowledgment to the left after accepting new data, and can offset inter-primitive latencies by providing buffering on long wires in the network.

Both interfaces of the pipeline primitive are transition signaling with bundled data, similar to the routing and arbitration primitives. In fact, the routing and arbitration primitives were designed for similar performance and exhibit similar latch controls as pipeline primitive.

Figure 19:
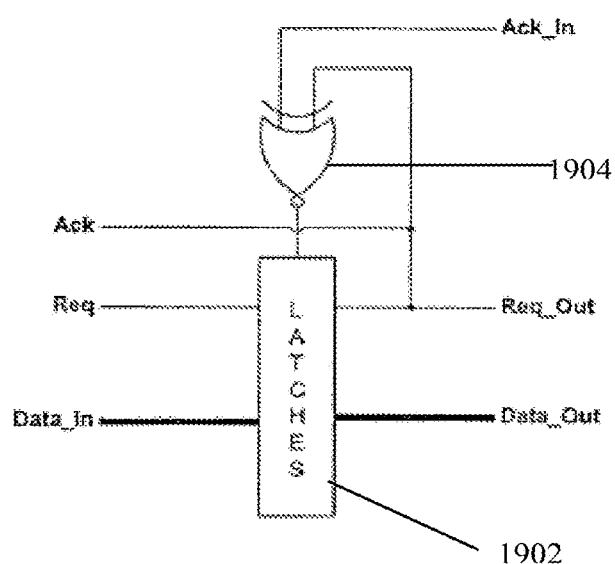
FIG. 19 is a block diagram illustrating a pipeline primitive in accordance with one embodiment of the disclosed subject matter.

As shown in FIG. 19, the MOUSETRAP pipeline stage includes a set of transparent D-latches 1902 and a latch controller 1904, which is comprised of a single standard logic gate, an XNOR. Initially, all inputs are low, and the XNOR latch controller 1904 is enabling the transparent latches 1902. First, Data appears at the input of the latches 1902 and is allowed to pass through to the following stage. Sometime after the data is stable, a Req transition appears at the input and also passes through a transparent latch 1902.

After the Req appears at the output, three events occur in parallel:
1. An $Req_{out}$ is generated to the right environment, signaling that new valid data is available.
2. An Ack is generated to the left environment, freeing it up to process a new data item.
3. The latch controller in the current stage quickly disables the latches (making them opaque) to protect and store the current data.

The latches will remain opaque, storing the data, until an $Ack_{In}$ is received from the right environment. At this point, the latches are made transparent and new data may arrive at the current stage.

Although the disclosed subject matter has been described and illustrated in the foregoing illustrative embodiments, it is understood that the present disclosure has been made only by way of example, and that numerous changes in the details of implementation of the disclosed subject matter can be made without departing from the spirit and scope of the disclosed subject matter, which is only limited by the claims which follow. Features of the disclosed embodiments can be combined and rearranged in various ways.

What is claimed is:

1. An asynchronous arbitration circuit, comprising:
    a multiplexer to output one of at least two data inputs to the multiplexer based on input received at a selection input of the multiplexer; and
    a mutual exclusion element to select a first arriving request from at least a first request signal and a second request signal, the mutual exclusion element including at least two outputs electrically connected to inputs of a latch element, the mutual exclusion element configured so that one of the at least two outputs of the mutual exclusion element corresponding to the selected first arriving request is outputted at an output of the latch element connected to the selection input of the multiplexer to cause selection of one of the at least two data inputs to the multiplexer corresponding to the first arriving request.

2. The circuit of claim 1, wherein the mutual exclusion element is further configured to cause the output of the latch element to be maintained after reset of the mutual exclusion element.

3. The circuit of claim 1, wherein the latch element comprises an SR flip flop.

4. The circuit of claim 1, further comprising:
    a first latch including an input, an output, and an enable input, the input of the first latch connected to the first request signal;
    a second latch including in input, an output, and an enable input, the input of the second latch connected to the second request signal;
    wherein one of the at least two outputs of the mutual exclusion element is connected to the enable input of the first latch and another of the at least two outputs of the mutual exclusion element is connected to the enable input of the second latch.

5. The circuit of claim 4, further comprising:
a third latch including an input, an output, and an enable input, the input of the third latch connected to receive output of the first latch and the output of the second latch combined through an XOR element; and
an XNOR element including two inputs and an output, the inputs of the XNOR element connected to receive the output of the third latch and an acknowledgement signal input from a succeeding stage, the output of the XNOR element connected to the enable input of the third latch and an enable input of a data register comprising an input connected to the output of the multiplexer.

6. The circuit of claim 5, wherein the first, second, and third latches comprise D latches.

7. The circuit of claim 4, further comprising an active low reset circuit configured to combine an active low reset signal, prior to the XNOR element, with the output of the third latch using an AND element.

8. The circuit of claim 4, further comprising:
a fourth latch including in input, an output, and an enable input, the input of the fourth latch being connected to the output of the first latch and the output of the fourth latch connected to an input of the mutual exclusion element through a logic element; and
a fifth latch including in input, an output, and an enable input, the output of the fourth latch connected to the input of the fifth latch, wherein one of the at least two outputs of the mutual exclusion element are connected to the enable input of the fifth latch, and the output of the fifth latch providing a first acknowledgement signal for output to a preceding stage.

9. The circuit of claim 4, further comprising:
a sixth latch an input, an output, and an enable input, the input of the sixth latch being connected to the output of the second latch and the output of the sixth latch being connected to an input of the mutual exclusion element through a logic element; and
a seventh latch including in input, an output, and an enable input, the output of the sixth latch being connected to the input of the seventh latch, an output of the mutual exclusion element being connected to the enable input of the seventh latch, and the output of the seventh latch providing a second acknowledgement signal for output to a preceding stage.

10. The circuit of claim 4, further comprising an eighth latch including an input, an output, and an enable input, the input of the eighth latch providing a first multi-flit input to receive an indicator to allow multiple successive flits of the first data input to pass through the mutual exclusion element uncontested.

11. The circuit of claim 10, wherein data received at the first data input comprises a multi-flit packet, each flit of the multi-flit packet including a corresponding glue bit indicating whether a succeeding flit is to be included in the multi-flit packet, the glue bits received at the first multi-flit input.

12. The circuit of claim 10, further comprising an active low reset input combined with the first multi-flit input using an OR element.

13. An asynchronous routing circuit, comprising:
a data splitter including an input and a first and a second output;
a first controller including an output providing a first request signal for output to a successive stage, the first controller further including a request input to receive a request signal from a preceding stage, and a first enable output to output a first enable signal to a first data register connected to a first output of the data splitter; and
a second controller including an output providing a second request signal for output to the successive stage, the second controller further including a request input for receiving the request signal from the preceding stage and a second enable output to output a second enable signal to a second data register of the data splitter;
wherein the first controller and the second controller are configured to activate, in response to at least the request signal, one of the first enable signal and the second enable signal to direct data inputted to the data splitter to one of the first data register or the second data register.

14. The circuit of claim 13, wherein the first and second controllers comprise respective first and second latches.

15. The circuit of claim 14, wherein the first and second latches each comprises one of: a toggle latch, or a D latch.

16. The circuit of claim 13, wherein a selection signal is provided as input to at least one of: the first controller, or the second controller.

17. The circuit of claim 13, wherein the first controller includes a first acknowledgement input to receive a first acknowledgement signal from a succeeding stage.

18. The circuit of claim 17, wherein the first controller includes an acknowledgement feedback input to receive an acknowledgement signal that is concurrently sent to a preceding stage.

19. The circuit of claim 18, wherein the acknowledgement signal that is sent to the preceding stage is formed by the combination of the first request signal and the second request signal in an XOR element.

20. The circuit of claim 18, wherein the first controller includes a request signal feedback input to receive the first request signal.

* * * * *